(12) United States Patent
Kojima et al.

(10) Patent No.: US 8,377,726 B2
(45) Date of Patent: Feb. 19, 2013

(54) METHOD FOR MANUFACTURING LIGHT EMITTING DEVICE AND LIGHT EMITTING DEVICE

(75) Inventors: Akihiro Kojima, Kanagawa-ken (JP);
Yoshiaki Sugizaki, Kanagawa-ken (JP);
Hideki Shibata, Kanagawa-ken (JP);
Hideo Tamura, Kanagawa-ken (JP);
Tetsuro Komatsu, Fukuoka-ken (JP);
Masayuki Ishikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 255 days.

(21) Appl. No.: 12/832,275

(22) Filed: Jul. 8, 2010

(65) Prior Publication Data
US 2011/0233586 A1 Sep. 29, 2011

(30) Foreign Application Priority Data

Mar. 23, 2010 (JP) ................. 2010-066925

(51) Int. Cl.
*H01L 21/66* (2006.01)
(52) U.S. Cl. .................. 438/26; 257/E33.057
(58) Field of Classification Search .................. 438/26, 438/27, 98, 99; 257/E33.057, E33.061, E33.063
See application file for complete search history.

(56) References Cited

U.S. PATENT DOCUMENTS

| 6,331,450 | B1 | 12/2001 | Uemura | |
|---|---|---|---|---|
| 8,110,421 | B2* | 2/2012 | Sugizaki et al. | 438/26 |
| 2006/0151802 | A1* | 7/2006 | Tsuchiya et al. | 257/99 |
| 2007/0007494 | A1 | 1/2007 | Hirosaki et al. | |
| 2009/0072195 | A1 | 3/2009 | Fukuda et al. | |
| 2009/0096361 | A1 | 4/2009 | Fukuda et al. | |
| 2009/0284948 | A1 | 11/2009 | Yamao et al. | |
| 2010/0025632 | A1 | 2/2010 | Fukuda et al. | |

(Continued)

FOREIGN PATENT DOCUMENTS

| EP | 1780592 A1 | 5/2007 |
|---|---|---|
| JP | 2003-110148 | 4/2003 |

(Continued)

OTHER PUBLICATIONS

Extended European Search Report for Application No. 10170104.3 issued on Jul. 20, 2011.

(Continued)

*Primary Examiner* — Thao P. Le
(74) *Attorney, Agent, or Firm* — Turocy & Watson, LLP

(57) ABSTRACT

According to one embodiment, a light emitting device includes a stacked body, a p-side and n-side electrodes, an insulating film, a p-side extraction electrode, an n-side extraction electrode, a resin layer and a phosphor layer. The stacked body has a first and a second surface opposite to each other and includes a light emitting layer. A p-side and an n-side electrode are provided on the second surface. An insulating film has openings to which the p-side and n-side electrodes are exposed. A p-side extraction electrode includes a p-side seed metal and a p-side metal wiring layer. An n-side extraction electrode includes an n-side seed metal and an n-side metal wiring layer. A resin layer is filled around the p-side and n-side extraction electrodes, and a phosphor layer is provided on a side of the first surface. Emission light from the light emitting layer is emitted through the first surface.

17 Claims, 21 Drawing Sheets

U.S. PATENT DOCUMENTS

| | | | |
|---|---|---|---|
| 2010/0148198 A1 | 6/2010 | Sugizaki et al. | |
| 2011/0027921 A1* | 2/2011 | Hamasaki et al. | 438/26 |
| 2011/0073889 A1* | 3/2011 | Sugizaki et al. | 257/98 |
| 2011/0114978 A1* | 5/2011 | Kojima et al. | 257/98 |
| 2011/0114986 A1* | 5/2011 | Kojima et al. | 257/99 |
| 2011/0204396 A1* | 8/2011 | Akimoto et al. | 257/98 |
| 2011/0220910 A1 | 9/2011 | Kojima et al. | |
| 2011/0220931 A1 | 9/2011 | Kojima | |
| 2011/0233585 A1* | 9/2011 | Kojima et al. | 257/98 |

FOREIGN PATENT DOCUMENTS

| | | |
|---|---|---|
| JP | 2005-079551 A | 3/2005 |
| JP | 2006-216933 | 8/2006 |
| JP | 2007-517404 | 6/2007 |
| JP | 2007-527123 A | 9/2007 |
| WO | 2007/105631 A1 | 9/2007 |
| WO | 2008096301 A1 | 8/2008 |
| WO | 2009069671 | 6/2009 |

OTHER PUBLICATIONS

European Examination Report for European Application No. 10170104 mailed on Sep. 5, 2012.

Japanese Office Action for Japanese Application No. 2010-066925 mailed on Jun. 13, 2012.

Japanese Office Action for Japanese Application No. 2010-066925 mailed on Nov. 7, 2012.

* cited by examiner

METHOD FOR MANUFACTURING LIGHT EMITTING DEVICE AND LIGHT EMITTING DEVICE

CROSS-REFERENCE TO RELATED APPLICATIONS

This application is based upon and claims the benefit of priority from the prior Japanese Patent Application No. 2010-066925, filed on Mar. 23, 2010; the entire contents of which are incorporated herein by reference.

FIELD

Embodiments described herein relate generally to a method for manufacturing a light emitting device and a light emitting device.

BACKGROUND

Light emitting devices capable of emitting visible and white light are expanding their applications to, for instance, illumination devices, display devices, and backlight sources for image display devices.

In these applications, there is a growing demand for downsizing. In this context, downsizing of electronic devices has been facilitated by an SMD (surface-mounted device) light emitting device in which a light emitting element chip is bonded onto a lead frame and molded with resin.

To replace fluorescent lamps and incandescent bulbs by illumination devices based on semiconductor light emitting devices having low power loss, it is necessary to enhance mass productivity and reduce cost.

An example technique is disclosed for further downsizing. In this example technique, a light emitting element chip is flip-chip connected to an interconnection layer provided on a transparent substrate so as to be externally driven through a columnar electrode and a ball. On the transparent substrate, the light emitting element chip and the columnar electrode are covered with a sealant.

However, this example needs the interconnection layer and the columnar electrode for bonding the light emitting element chip onto the transparent substrate with high positional accuracy, and is insufficient to meet the requirements for downsizing and mass productivity.

DETAILED DESCRIPTION

In general, according to one embodiment, a method for manufacturing a light emitting device is disclosed. The method can form a stacked body including a light emitting layer and having a first surface adjacent to a first surface of a translucent substrate. The method can form an insulating film having a first and second opening on a p-side electrode and an n-side electrode provided on a side of a second surface opposite to the first surface of the stacked body. The method can form a seed metal covering the insulating film and the first and second opening. The method can form a p-side metal interconnection layer and an n-side metal interconnection layer on the seed metal. The method can separate the seed metal into a p-side seed metal and an n-side seed metal by removing the seed metal exposed between the p-side metal interconnection layer and the n-side metal interconnection layer. The method can form a resin in at least part of the space from which the seed metal is removed, and form a phosphor layer containing silicon (Si), aluminum (Al), oxygen (O), and nitrogen (N) on a side of the first surface of the stacked body including the light emitting layer.

According to another embodiment, a light emitting device includes a stacked body, a p-side electrode and an n-side electrode, an insulating film, a p-side extraction electrode, an n-side extraction electrode, a resin layer and a phosphor layer. The stacked body has a first surface and a second surface opposite to the first surface and includes a light emitting layer. A p-side electrode and an n-side electrode are provided on the second surface of the stacked body. An insulating film has openings to which the p-side electrode and the n-side electrode are exposed. A p-side extraction electrode includes a p-side seed metal provided on the p-side electrode and a p-side metal interconnection layer provided on the p-side seed metal. An n-side extraction electrode includes an n-side seed metal provided on the n-side electrode and an n-side metal interconnection layer provided on the n-side seed metal. A resin layer is filled around the p-side extraction electrode and the n-side extraction electrode, and a phosphor layer containing silicon (Si), aluminum (Al), oxygen (O), and nitrogen (N) is provided on a side of the first surface of the stacked body including the light emitting layer. Emission light from the light emitting layer is emitted through the first surface of the stacked body.

Embodiments will now be described with reference to the drawings.

Figure 1A:
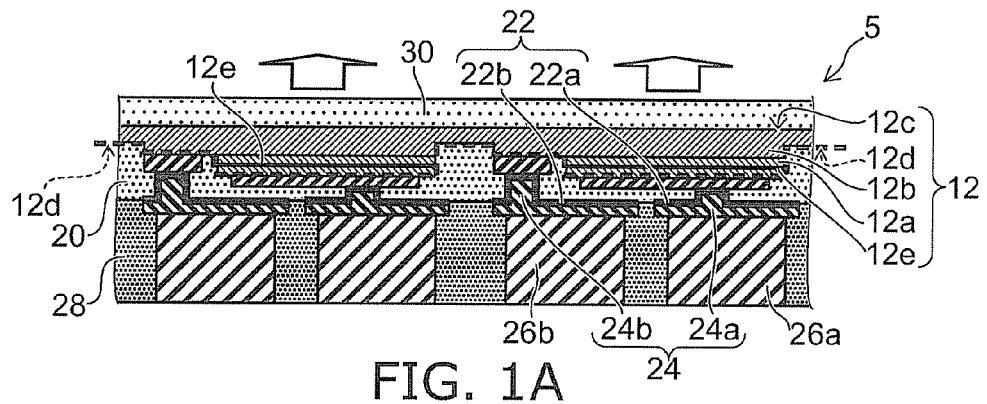
FIGS. 1A to 1C are schematic views of a light emitting device (WLP) according to a first embodiment.
Figure 1B:
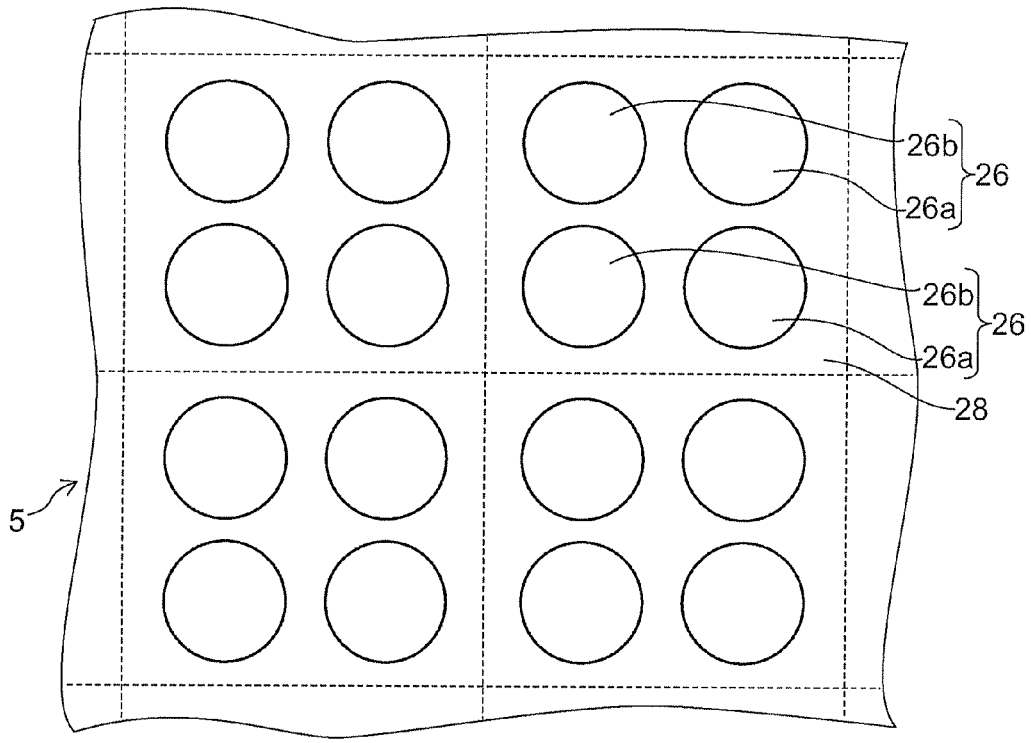
Figure 1C:
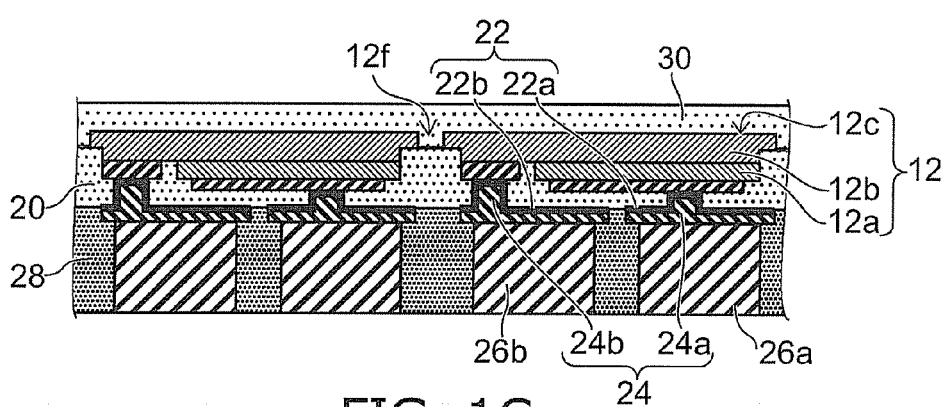

FIGS. 1A to 1C are schematic views of a light emitting device according to a first embodiment. More specifically, FIG. 1A is a sectional view, FIG. 1B is a bottom view, and FIG. 1C is a sectional view of a first variation.

A stacked body 12 has an upper layer 12a including a light emitting layer 12e, and a lower layer 12b, and has a first surface 12c which is exposed, and a second surface 12d on the opposite side thereof. The upper layer 12a illustratively includes a p-type cladding layer, a light emitting layer 12e, and an n-type cladding layer. The lower layer 12b is illustratively of n-type and serves as a lateral path of current. However, the conductivity type is not limited thereto, but may be the opposite conductivity type. The light emitting layer 12e can illustratively emit light with a wavelength of 250 to 500 nm. As indicated by the block arrow, light from the light emitting layer 12e can be emitted primarily from the first surface 12c of the stacked body 12 in the upward direction of FIG. 1A.

A p-side electrode 14 provided on the surface of the upper layer 12a of the stacked body 12 is connected to a p-side metal interconnection layer 24a through a p-side seed metal 22a. Furthermore, an n-side electrode 16 is connected to an n-side metal interconnection layer 24b through an n-side seed metal 22b. An insulating film 20 illustratively made of an organic or inorganic material is filled between the seed metal 22a, 22b and the second surface 12d.

A p-side metal pillar 26a and an n-side metal pillar 26b are provided on the p-side metal interconnection layer 24a and the n-side metal interconnection layer 24b, respectively, and surrounded by a (reinforcing) resin 28 so as to expose at least the surface of the metal pillars 26. Even if the stacked body 12 is thin, its mechanical strength can be maintained by thickening the metal pillars 26a, 26b and the reinforcing resin 28. The metal pillars 26 serve to reduce stress applied to the stacked body 12 through mounting terminals.

The metal interconnection layer 24a, 24b and the metal pillar 26a, 26b can be illustratively made of a material such as copper, gold, nickel, and silver. Among them, copper is more preferable, because it has good thermal conductivity, high migration resistance, and superior adhesion to the insulating film. Although the following embodiments assume that the material of the metal interconnection layer 24 and the metal pillar 26 is copper, it is understood that the material is not limited to copper.

The p-side seed metal 22a, the p-side copper interconnection layer 24a, and the p-side copper pillar 26a constitute a p-side extraction electrode which can be connected to the p-side electrode 14 provided in the stacked body 12.

Furthermore, the n-side seed metal 22b, the n-side copper interconnection layer 24b, and the n-side copper pillar 26b constitute an n-side extraction electrode which can be connected to the n-side electrode 16 provided in the stacked body 12.

The thickness of the p-side copper pillar 26a is thicker than the thickness of the p-side copper interconnection layer 24a, and the thickness of the n-side copper pillar 26b is thicker than the thickness of the n-side copper interconnection layer 24b. Furthermore, the thickness of the p-side copper pillar 26a and the n-side copper pillar 26b is thicker than the thickness of the stacked body 12. However, the aspect ratio of the p-side copper pillar 26a and the n-side copper pillar 26b does not need to be one or more. The thickness of the stacked body 12 is illustratively 5 to 6 μm.

In FIGS. 1A to 1C, the diameter of the copper pillar 26 is larger than the diameter of the opening portion of the copper interconnection layer 24 in contact with the p-side electrode 14 or the n-side electrode 16. Here, the shape may be other than a circle, and in that case, the area of the base of the copper pillar 26 is larger than the area of the opening portion of the copper interconnection layer 24 in contact with the p-side electrode 14 or the n-side electrode 16.

Furthermore, a contact area between the n-side interconnection layer 24b and the n-side metal pillar 26b is larger than a contact area between the n-side interconnection layer 24b and the n-side electrode 16. A contact area between the p-side interconnection layer 24a and the p-side metal pillar 26a is larger than a contact area between the p-side interconnection layer 24a and the p-side electrode 14.

Furthermore, a phosphor layer 30 is provided on the first surface 12c side of the stacked body 12 including the light emitting layer 12e. It can absorb emission light from the light emitting layer 12e and emit wavelength-converted light. Thus, it is possible to emit mixed light of the emission light from the light emitting layer 12e and the wavelength-converted light. If the light emitting layer 12e is nitride-based, a white color or light bulb color can illustratively be obtained as a mixed color of blue light, which is the emission light, and yellow light, which is the wavelength-converted light from a yellow phosphor.

In this embodiment, the phosphor layer 30 with a generally uniform thickness is provided near the light emitting layer 12e, and the emission light is injected into the phosphor layer 30 before diverging. This facilitates reducing color unevenness by bringing close to each other the spread of light of the emission light from the light emitting layer and that of the wavelength-converted light.

The phosphor layer 30 is primarily composed of silicone resin, for instance, and a phosphor is contained in this resin. The phosphor is a granular phosphor made of a sialon compound (Si, Al, O, N) doped with an emission center element.

For instance, the phosphor layer 30 contains, as a first phosphor, a phosphor which exhibits a light emission peak at a wavelength ranging from 490 to 580 nm when excited by light with a wavelength of 250 to 500 nm, and satisfies the following formula (1).

$$(M_{1-x}R_x)_{a2}AlSi_{b2}O_{c2}N_{d2} \quad (1)$$

In the above formula (1), M is at least one metallic element except Si and Al, and R is an emission center element.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relations $0<x\leq 1$, $0.93<a2<1.3$, $4.0<b2<5.8$, $0.6<c2<1$, and $6<d2<11$.

Alternatively, the phosphor layer 30 contains, as a second phosphor, a phosphor which exhibits a light emission peak at a wavelength ranging from 490 to 580 nm when excited by light with a wavelength of 250 to 500 nm, and satisfies the following formula (2).

$$(M_{1-x}R_x)_{a2}AlSi_{b2}O_{c2}N_{d2} \quad (2)$$

In the above general formula (2), M is at least one metallic element except Si and Al, and R is an emission center element.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relations $0<x\leq 1$, $0.94<a2<1.1$, $4.1<b2<4.7$, $0.7<c2<0.85$, and $7<d2<9$.

Alternatively, the phosphor layer 30 contains, as a third phosphor, a phosphor which exhibits a light emission peak at a wavelength ranging from 580 to 700 nm when excited by light with a wavelength of 250 to 500 nm, and satisfies the following formula (3).

$$(M_{1-x}R_x)_{a1}AlSi_{b1}O_{c1}N_{d1} \quad (3)$$

In the above formula (3), M is at least one metallic element except Si and Al, and R is an emission center element.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, TI, Pb, Bi, and Fe. Here, x, a1, b1, c1, and d1 satisfy the relations $0<x\leq1$, $0.6<a1<0.95$, $2<b1<3.9$, $0.25<c1<0.45$, and $4<d1<5.7$.

Furthermore, in the phosphor layer 30, the first phosphor and the third phosphor, or the second phosphor and the third phosphor may be mixed. In this case, the blue color of light emitted from the light emitting layer 12e, the green color of light emitted from the first phosphor or the second phosphor, and the red color of light emitted from the third phosphor are mixed so that the light emitting device 5 can emit white light with high color rendition.

FIGS. 1A and 1B show a light emitting device based on WLP (wafer-level package). That is, one block indicated by the dashed line in FIG. 1B corresponds to a singulated light emitting device. Such wafer-level assembly facilitates implementing CSP (chip size package), where the light emitting device is downsized close to the bare chip size. Furthermore, the sealing resin can be omitted, which facilitates achieving lower profile. Thus, this embodiment can be referred to as a WLP light emitting device.

FIG. 1C shows a light emitting device according to a first variation.

Also in the light emitting device according to the first variation, a phosphor layer 30 is provided on the first surface 12c side of the stacked body 12 including the light emitting layer 12e. In the stacked body 12, the separating portion 12f of the chip to be singulated is removed, which facilitates avoiding cracking of GaN or other material, which is thin, hard, and brittle.

Figure 2A:
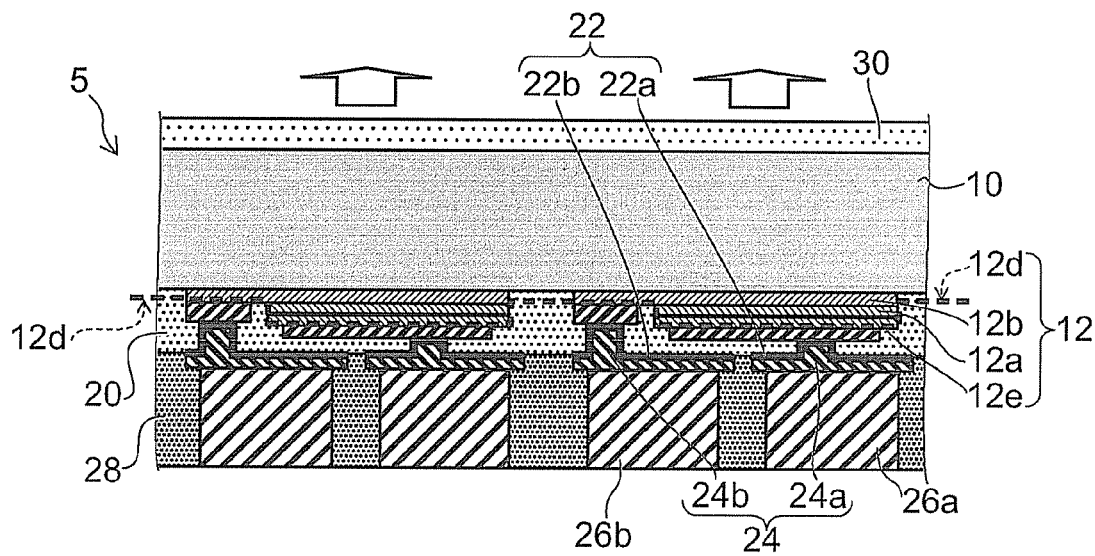
FIGS. 2A and 2B are schematic sectional view of a variation of the first embodiment.
Figure 2B:
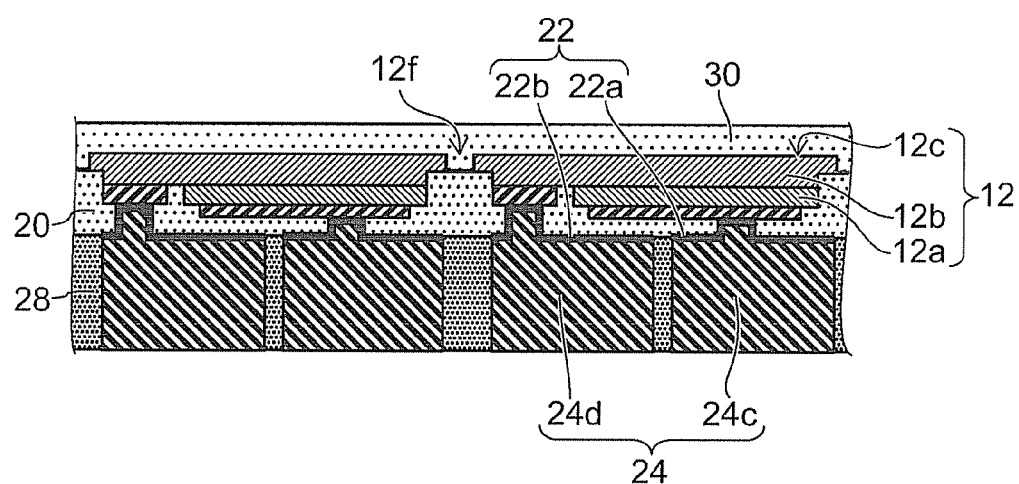

FIGS. 2A and 2B are schematic sectional views of light emitting devices according to other variations of the first embodiment. More specifically, FIG. 2A shows a second variation, and FIG. 2B shows a third variation.

In the second variation of FIG. 2A, in the case where the light emitting layer 12e is made of a nitride semiconductor, the stacked body 12 is often crystal-grown on a sapphire or other translucent substrate 10, or crystal-grown on a GaAs or other provisional substrate and then transferred onto a translucent substrate 10 by a wafer bonding process or the like. FIG. 2A shows a WLP light emitting device with the translucent substrate 10 left behind. The substrate in the crystal growth process is often as thick as several hundred μm to reduce cracking and warpage. In this embodiment, the translucent substrate 10 can be thinned by grinding, because the mechanical strength can be increased by the copper pillar 26 and the filling of the reinforcing resin 28. Also in the light emitting device according to the second variation, a phosphor layer 30 is provided on the upper side of the translucent substrate 10.

The third variation of FIG. 2B uses a thick copper interconnection layer 24c, 24d as an extraction electrode without providing a copper pillar. This can simplify the structure and manufacturing process. Also in the light emitting device according to the first variation, a phosphor layer 30 is provided on the first surface 12c side of the stacked body 12 including the light emitting layer 12e.

FIGS. 3A to 5D illustrate the method for manufacturing a light emitting device of the first embodiment up to the process for forming a reinforcing resin.

FIGS. 3A to 3D show the process from the formation of a light emitting element to the film formation of a seed metal.

A stacked body 12 having a lower layer 12b illustratively including a buffer layer and an n-type layer, and an upper layer 12a, is formed on a first surface 10a of a translucent substrate 10 illustratively made of sapphire. The first surface 12c of the stacked body 12 is contiguous to the first surface 10a of the translucent substrate 10 and generally flat. The second surface (dashed line) 12d of the stacked body 12 includes the surface of the upper layer 12a and the surface of the lower layer 12b exposed by removal of the upper layer 12a, and thus has a step difference.

Figure 3A:
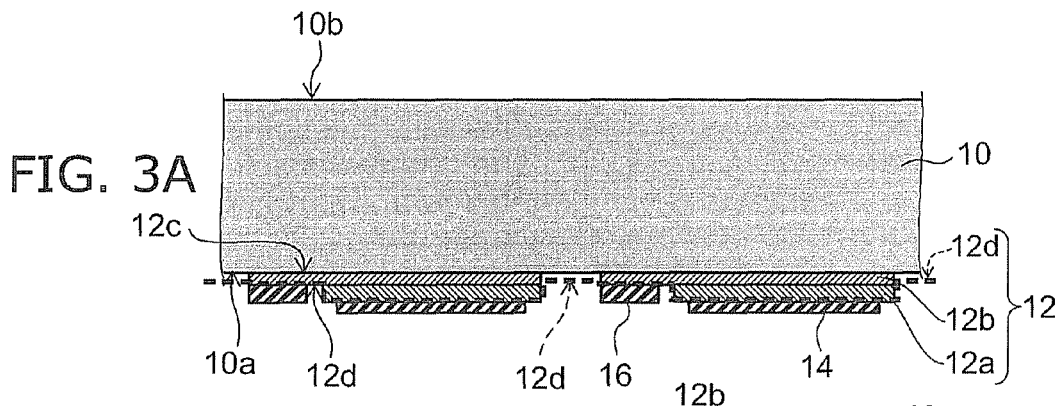
FIGS. 3A to 6B are process sectional views of the light emitting device according to the first embodiment.
Figure 3B:
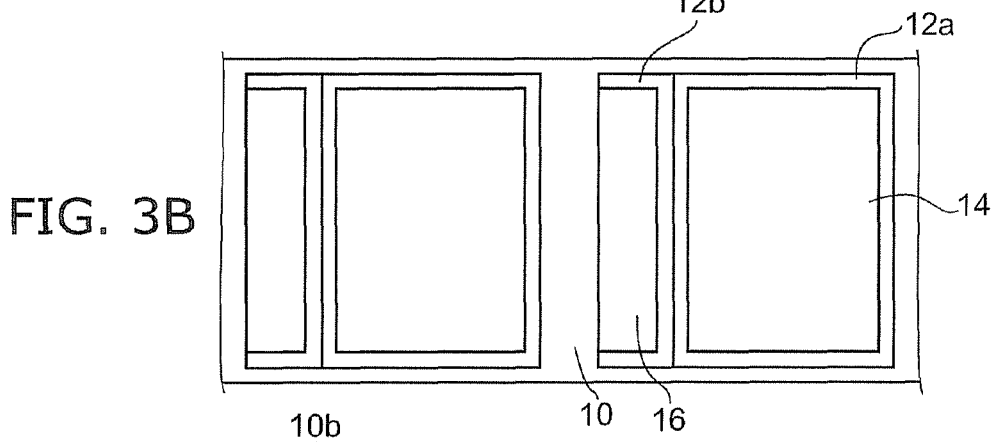
Figure 3C:
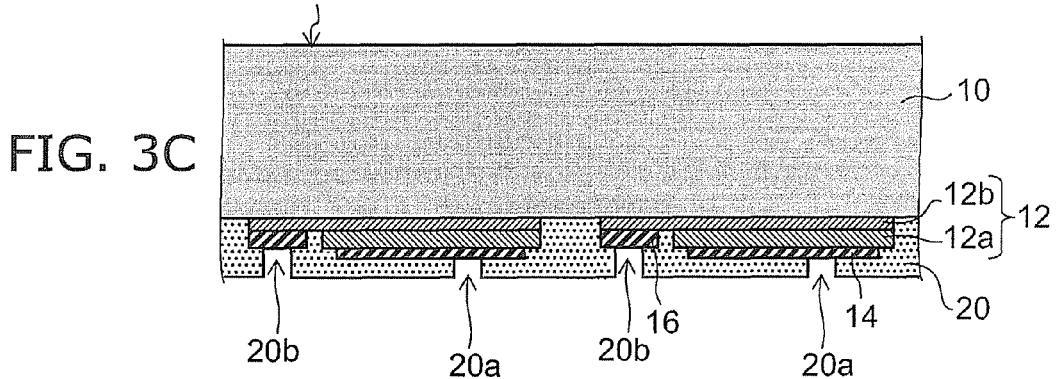
Figure 3D:
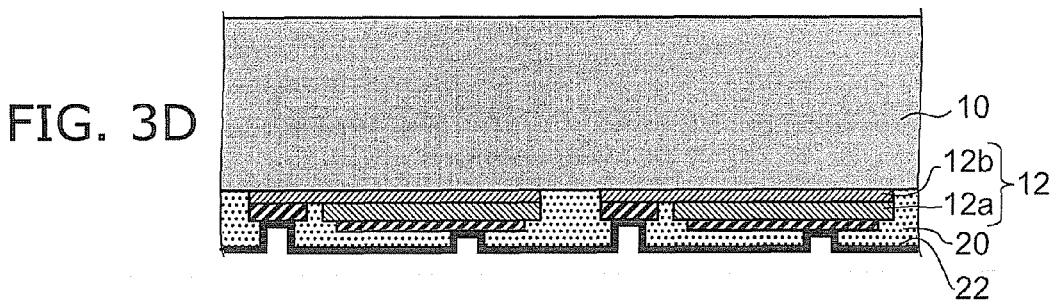

A p-side electrode 14 is formed on the surface of the upper layer 12a, and an n-side electrode 16 is formed on the surface of the lower layer 12b. The result is as shown in FIG. 3A. FIG. 3B shows the electrode pattern. An insulating film 20 is formed so as to cover the p-side electrode 14 and the n-side electrode 16, and openings (first opening and second opening) 20a, 20b are formed so as to expose part of the p-side electrode 14 and the n-side electrode 16, respectively (FIG. 3C). Furthermore, a seed metal 22 illustratively made of Ti/Cu is formed by sputtering, for instance (FIG. 3D).

Here, for instance, the n-side electrode 16 can illustratively be a multi-layer of Ti/Al/Pt/Au, and the p-side electrode 14 can illustratively be a multi-layer of Ni/Al (or Ag)/Au. In the p-side electrode 14, sandwiching a high-reflection film illustratively made of Al or Ag facilitates reflecting upward the emission light from the light emitting layer 12e to extract a high optical output. Furthermore, because the seed metal 22 is provided, a pad made of Au can be omitted.

Figure 4A:
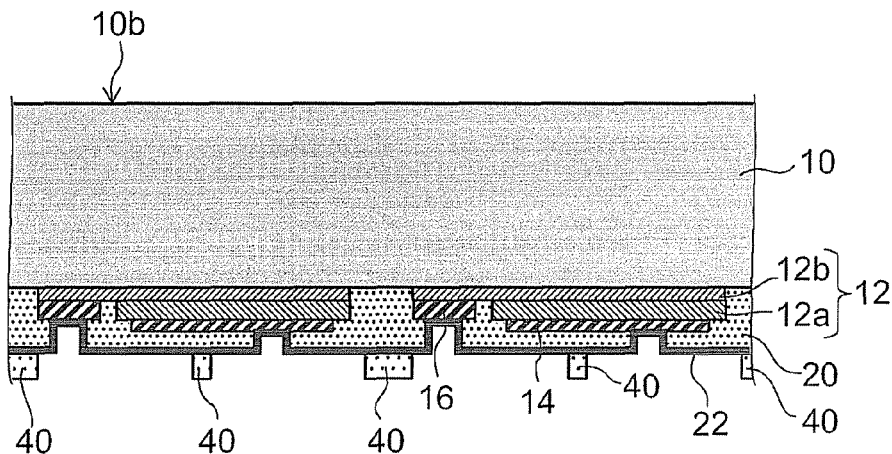
Figure 4B:
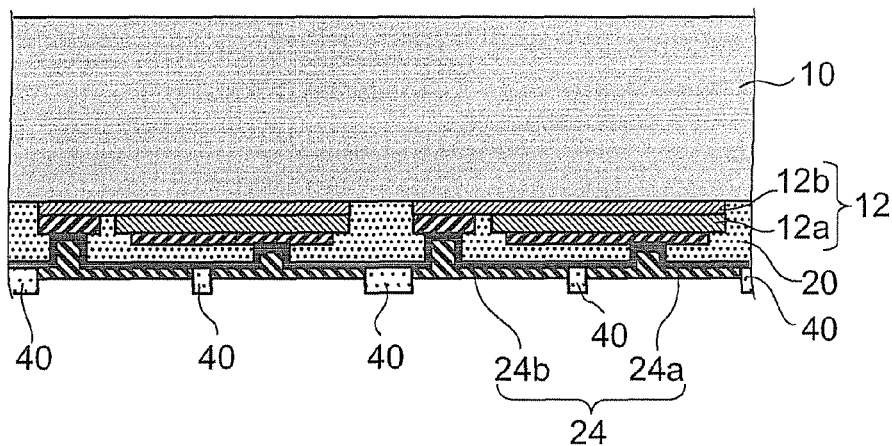
Figure 4C:
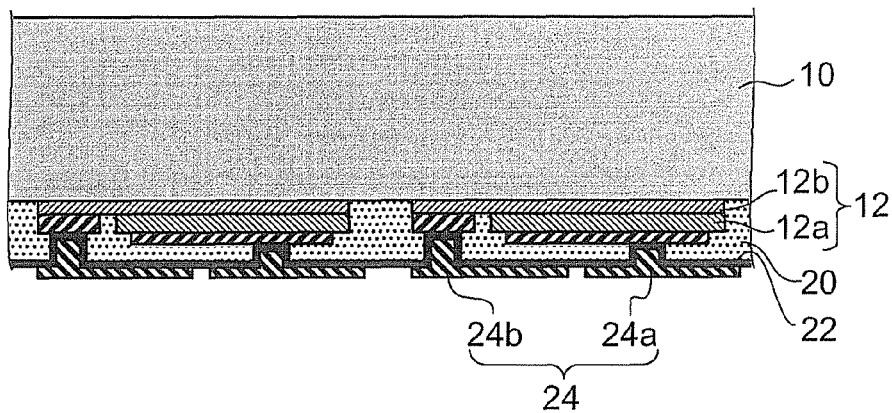

FIGS. 4A to 4C are process sectional views showing the process for forming copper interconnection layers.

For instance, a photoresist 40 is patterned on the seed metal 22 (FIG. 4A), and the patterned photoresist 40 is used as a mask to selectively form copper interconnection layers 24 by electrolytic plating. Thus, copper interconnection layers 24a, 24b separated from each other are formed (FIG. 4B). Preferably, the copper interconnection layers 24a, 24b are formed so that the diameter or the area of the base of the copper interconnection layer 24a, 24b is larger than that of 20a, 20b. Here, the thin seed metal 22 serves as a current path in the electrolytic plating process. Subsequently, the photoresist 40 is removed illustratively by ashing, which results in the structure shown in FIG. 4C.

FIGS. 5A to 5D show the process for forming a copper pillar and reinforcing resin.

Figure 5A:
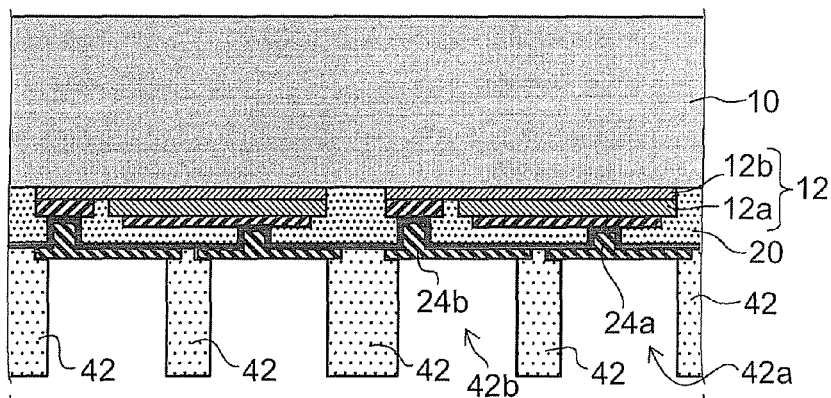
Figure 5B:
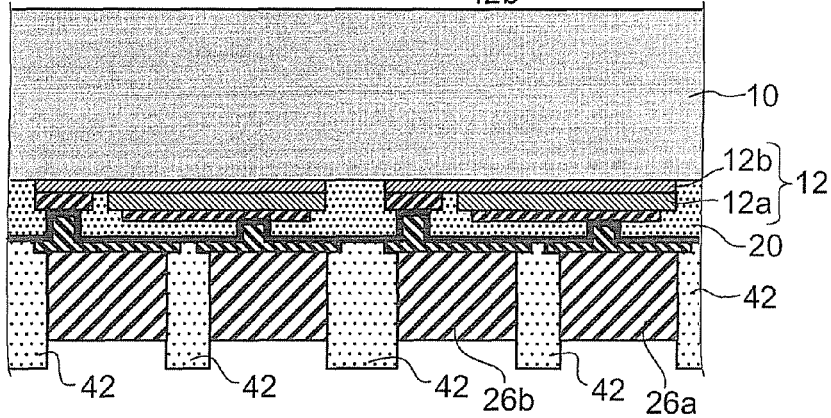

As shown in FIG. 5A, a thick-film photoresist is patterned to form an opening 42a on the p-side copper interconnection layer 24a and an opening 42b on the n-side copper interconnection layer 24b. Subsequently, a p-side copper pillar 26a connected to the p-side electrode 14 and an n-side copper pillar 26b connected to the n-side electrode 16 are formed by electrolytic plating (FIG. 5B). Here again, the thin seed metal 22 serves as a current path in the electrolytic plating process. If the thickness of the copper pillar 26 is in the range of e.g. 10 to several hundred μm, the strength of the light emitting device can be maintained even when the translucent substrate 10 is separated. Here, alternatively, the openings 42a, 42b may be formed in an insulating film.

Figure 5C:
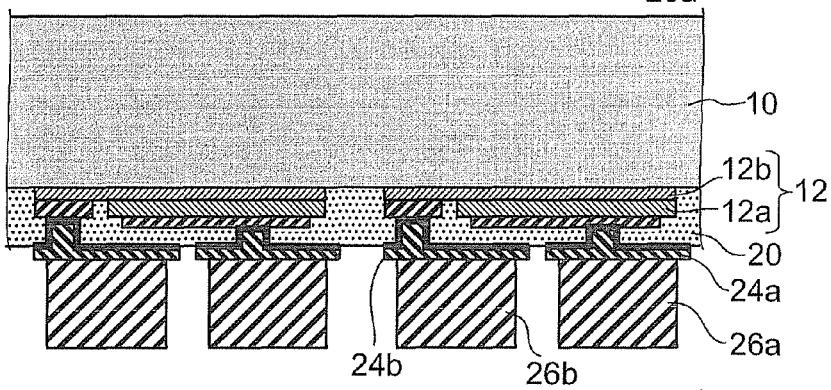

Then, the resist layer 42 is removed illustratively by ashing, and the exposed region of the seed metal 22 is removed illustratively by wet etching. Thus, the seed metal 22 is separated into a p-side seed metal 22a and an n-side seed metal 22b (FIG. 5C).

Figure 5D:
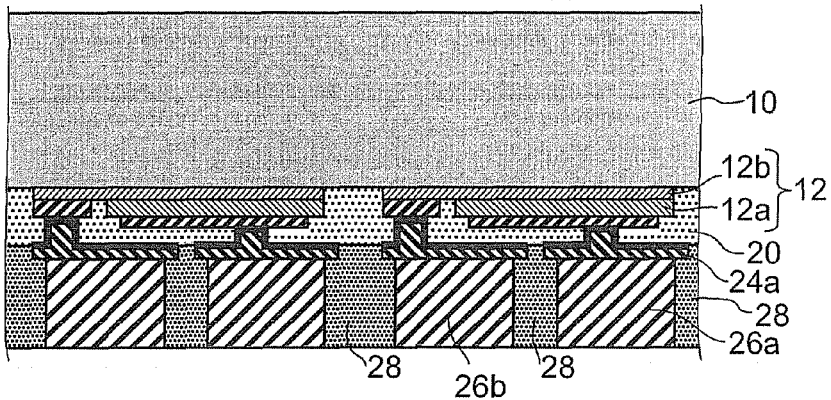

Subsequently, a reinforcing resin 28 is formed around the copper pillar 26a, 26b to a thickness generally equal to or less than the thickness of the copper pillar 26a, 26b (FIG. 5D). Here, instead of the copper pillar 26a, 26b, if a thick copper interconnection layer 24c, 24d is formed, the light emitting device according to the third variation shown in FIG. 2B is formed.

Here, the layer made of the resin and metal is soft, and the metal is formed by plating at near normal temperature. Hence, the residual stress occurring with respect to the translucent substrate 10 is relatively low. In the conventional technique for separating the stacked body 12 from the translucent substrate 10 at wafer level, for instance, it is bonded to a silicon substrate with a metal layer formed thereon using Au—Sn solder at a high temperature of 300° C. or more, and then the stacked body 12 made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks (fractures) in the thin, brittle stacked body 12. In contrast, in this embodiment, the residual stress is low, and the stacked body 12 is separated in the state of being fixed to a soft support. Hence, the device can be manufactured at high yield without trouble such as cracking in the stacked body 12.

Furthermore, this embodiment based on WLP can readily achieve a small light emitting device close to the chip size, which is typically several hundred μm to several mm for the stacked body 12 made of nitride materials.

Such a manufacturing method does not require mounting members such as a lead frame and ceramic substrate, and can perform the interconnection process and sealing process at wafer level. Furthermore, inspection can be performed at wafer level. Hence, the productivity of the manufacturing process can be enhanced, which consequently facilitates cost reduction.

Figure 6A:
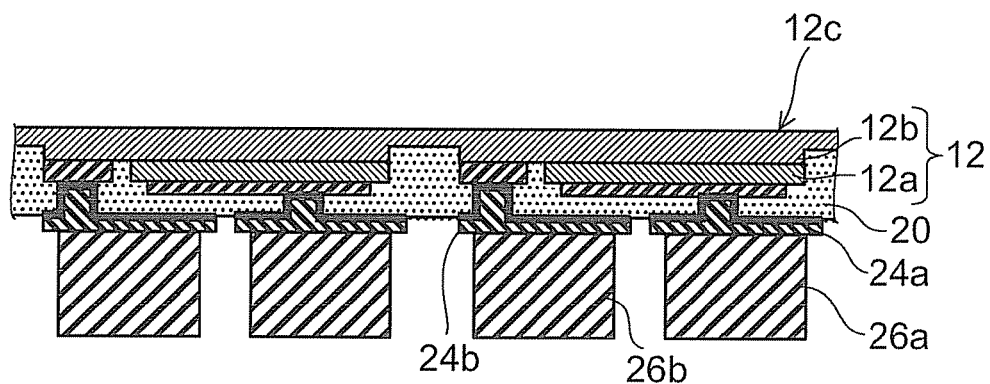
Figure 6B:
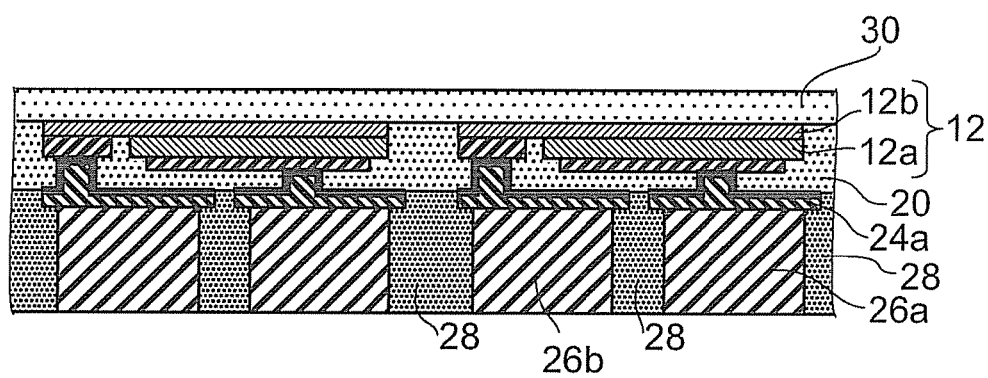

FIGS. 6A and 6B are process sectional views of the process for stripping the translucent substrate and forming a phosphor layer in the method for manufacturing a light emitting device of the first embodiment.

The translucent substrate 10 is stripped from the light emitting device (WLP) 5 to expose the first surface 12c of the stacked body 12 as shown in FIG. 6A. For instance, the translucent substrate 10 is stripped from the light emitting device (WLP) 5 by a laser lift-off process and the like.

As shown in FIG. 6B, a phosphor layer 30 is formed on the exposed first surface 12c of the stacked body 12. The phosphor layer 30 can be formed to a thickness in the range from several to several hundred μm illustratively by the sputtering method, the ink-jet method, the method of applying a silicone resin mixed with phosphor particles, the method of applying a liquid glass mixed with phosphor particles, and the screen printing method.

For instance, the screen printing method is one selected from:

(1) the method of screen printing a paste-like silicone resin containing the first phosphor onto the first surface 12c of the stacked body 12, (2) the method of screen printing a paste-like silicone resin containing the second phosphor onto the first surface 12c of the stacked body 12, (3) the method of screen printing a paste-like silicone resin containing the third phosphor onto the first surface 12c of the stacked body 12, (4) the method of screen printing a paste-like silicone resin containing the first phosphor and the third phosphor onto the first surface 12c of the stacked body 12, and (5) the method of screen printing a paste-like silicone resin containing the second phosphor and the third phosphor onto the first surface 12c of the stacked body 12.

After the printing, the paste-like silicone resin is heat cured or light cured to form a phosphor layer 30 containing the phosphor(s).

Here, if the phosphor layer 30 is formed on the upper side of the translucent substrate 10 without stripping the translucent substrate 10 from the light emitting device (WLP) 5, the light emitting device of the second variation shown in FIG. 2A is formed.

Next, other embodiments are described.

Figure 7A:
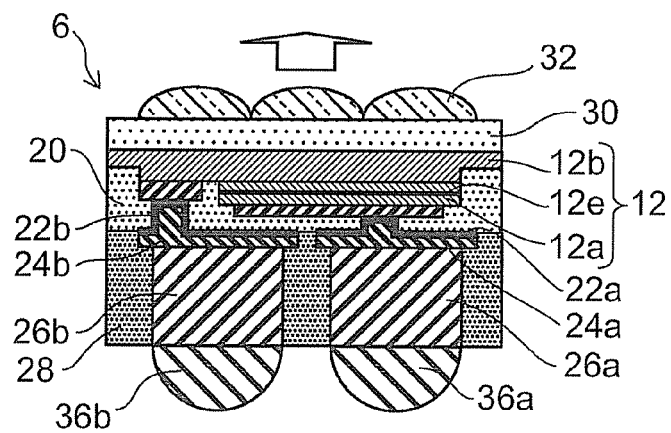
FIGS. 7A to 7D are schematic views of a light emitting device according to a second embodiment.
Figure 7B:
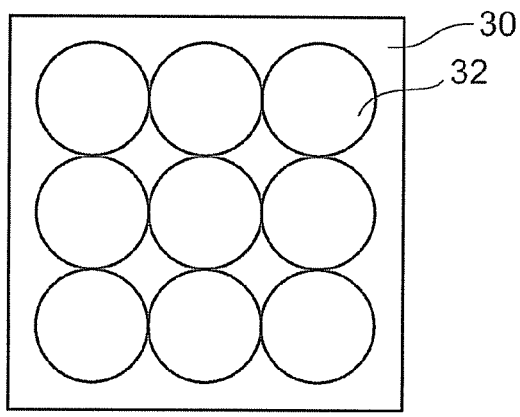
Figure 7C:
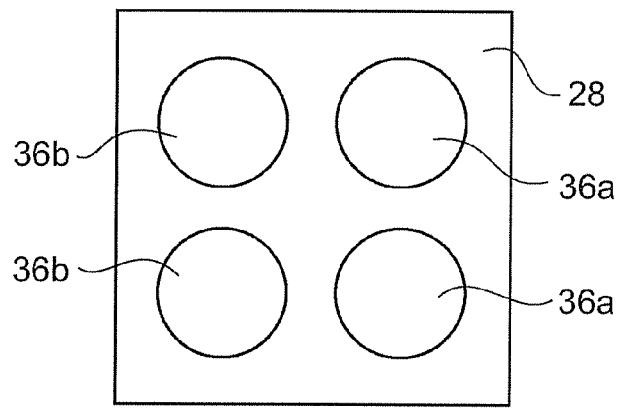
Figure 7D:
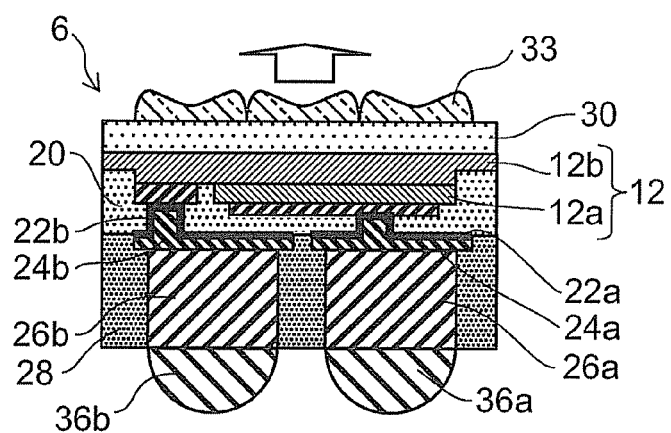

FIGS. 7A to 7D are schematic views of a singulated light emitting device according to a second embodiment. More specifically, FIG. 7A is a sectional view, FIG. 7B is a top view, FIG. 7C is a bottom view, and FIG. 7D is a sectional view of a variation.

In addition to the structure of the first embodiment shown in FIG. 1A, a solder ball 36a and a solder ball 36b are provided on the surface of the copper pillar 26a and the surface of the copper pillar 26b, respectively, in a BGA (ball grid array) configuration. The material of the solder ball 36 is not limited, but can be lead-free by using SnAg, for instance.

On the other hand, a phosphor layer 30 is provided to a generally uniform thickness on the first surface 12c of the stacked body 12. The phosphor layer 30 can absorb emission light from the light emitting layer 12e and emit wavelength-converted light. Thus, it is possible to emit mixed light of the emission light from the light emitting layer 12e and the wavelength-converted light. If the light emitting layer 12e is nitride-based, a white color or light bulb color can illustratively be obtained as a mixed color of blue light, which is the emission light, and yellow light, which is the wavelength-converted light from a yellow phosphor.

In this embodiment, the phosphor layer 30 with a generally uniform thickness is provided near the light emitting layer 12e, and the emission light is injected into the phosphor layer 30 before diverging. This facilitates reducing color unevenness by bringing close to each other the spread of light of the emission light from the light emitting layer and that of the wavelength-converted light.

Furthermore, as shown in FIG. 7A, a convex lens 32 illustratively made of quartz glass can be further provided on the phosphor layer 30 to converge the mixed light of white or light bulb color, for instance, which facilitates achieving higher brightness. Furthermore, because the convex lens 32 is provided near the light emitting layer 12e without the intermediary of a sealing resin, the size of the lens can be decreased, which facilitates downsizing the device.

Thus, WLP facilitates downsizing the light emitting device. Furthermore, because the convex lens 32 can be formed in the wafer state, an assembly process with high productivity can be realized, which facilitates cost reduction. In this embodiment, the solder ball 36 provided on the surface of the copper pillar 26 facilitates installation on the mounting substrate.

In the variation shown in FIG. 7D, a concave lens 33 is provided instead of the convex lens so that the emission light can diverge. For instance, for use as a backlight source and the like, the emission light needs to be incident on the side surface of a light guide plate so as to spread along the surface of the light guide plate. The concave lens 33 is suitable for this case.

FIGS. 8A to 8E are process sectional views of a method for manufacturing a light emitting device according to the second embodiment.

Figure 8A:
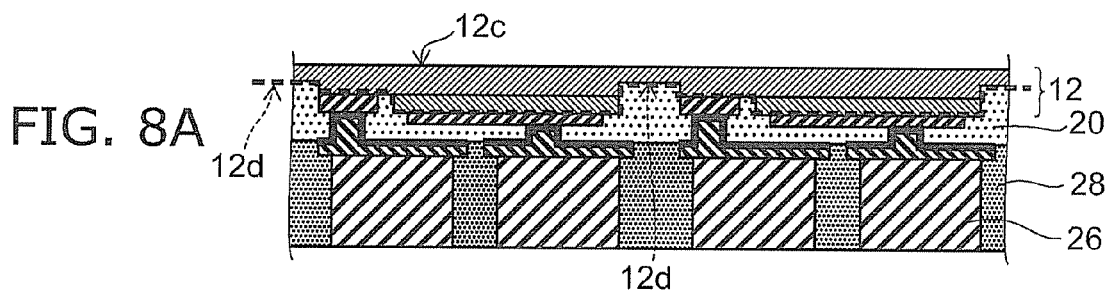
FIGS. 8A to 8E are process sectional views of the light emitting device according to the second embodiment.

FIG. 8A shows a light emitting device (WLP) 5 from which the translucent substrate 10 is stripped off.

Figure 8B:
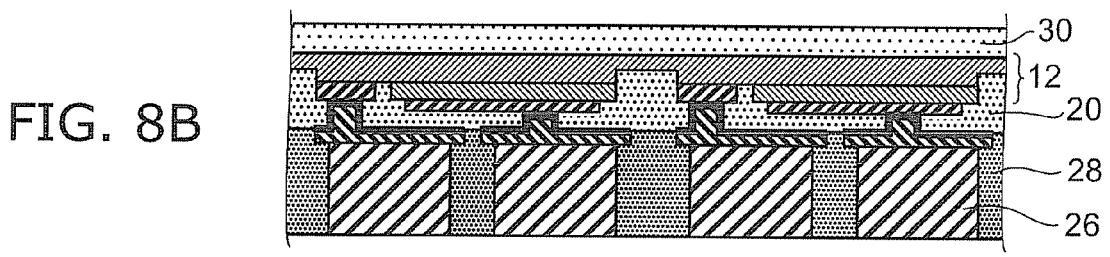
Figure 8C:
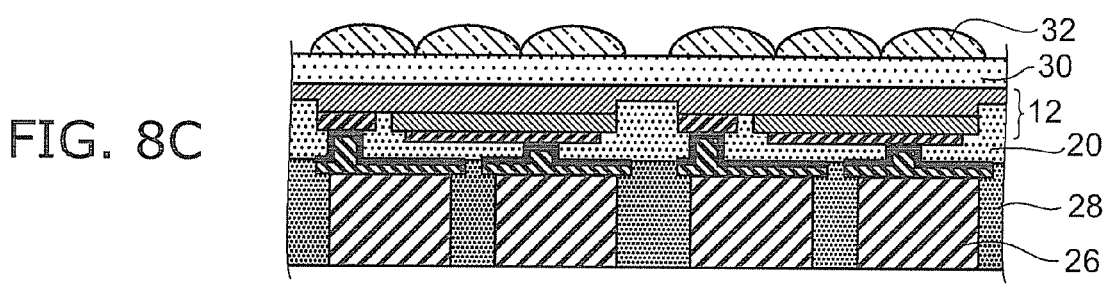
Figure 8D:
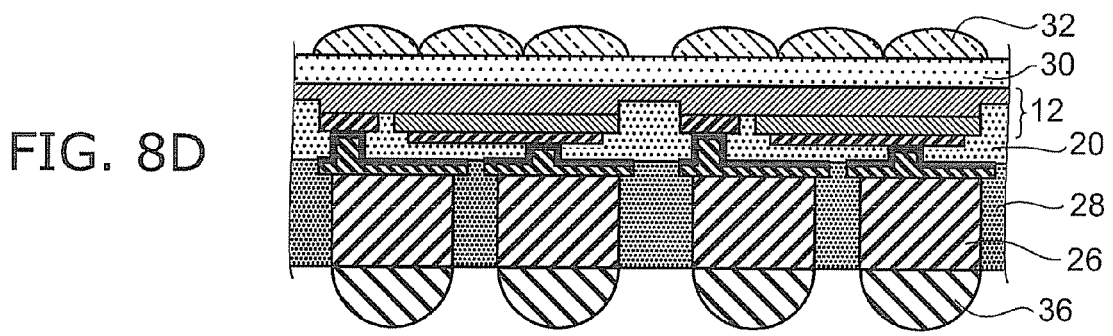
Figure 8E:
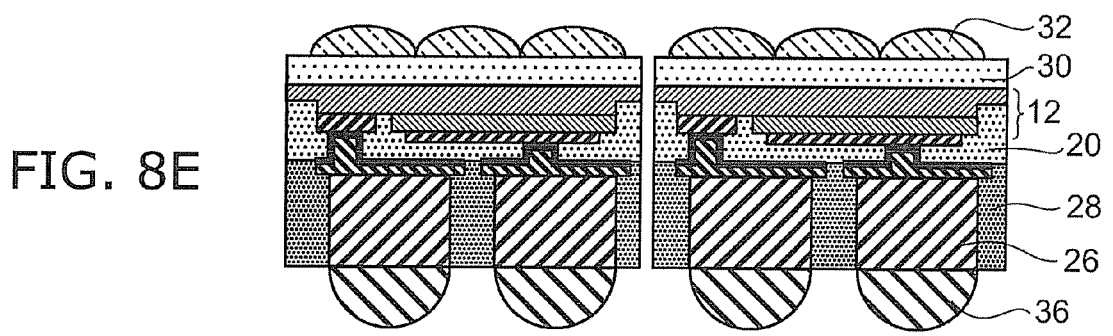

A phosphor layer 30 is formed on the exposed first surface 12c of the stacked body 12. The phosphor layer 30 can be formed to a thickness in the range from several to several hundred μm illustratively by the sputtering method, the ink-jet method, the method of applying a silicone resin mixed with phosphor particles, the method of applying a liquid glass mixed with phosphor particles, and the screen printing method (FIG. 8B). Subsequently, a convex lens 32 is formed from quartz glass, for instance (FIG. 8C), and a solder ball 36 is formed on the surface of the copper pillar 26 (FIG. 8D). Thus, a WLP-based light emitting device is completed. Furthermore, dicing is used for singulation (FIG. 8E), which is easy because the translucent substrate 10 is removed. Here, cutting can be performed by a method such as mechanical cutting using a diamond blade or the like, cutting by laser irradiation, and cutting by high-pressure water.

Figure 9A:
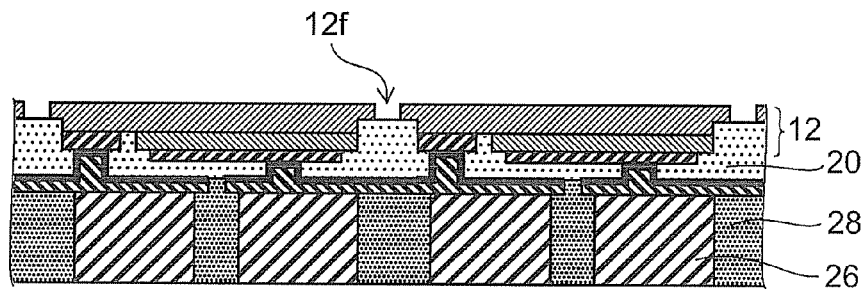
FIGS. 9A to 9C are process sectional views of a method for manufacturing a first variation of the second embodiment.
Figure 9B:
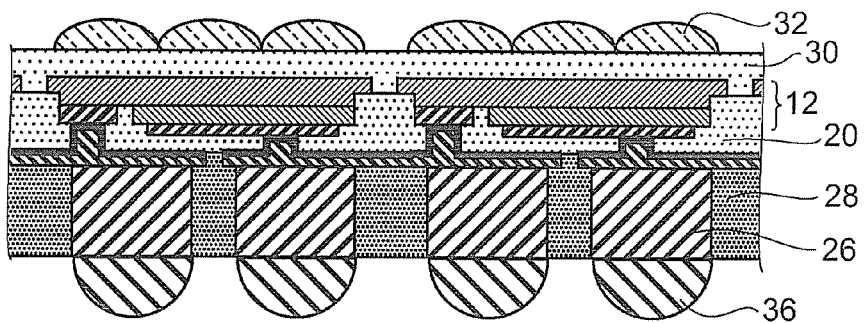
Figure 9C:
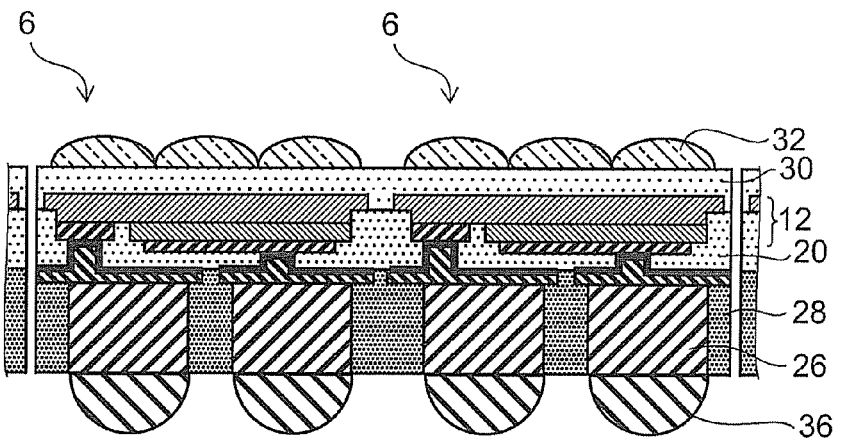

FIGS. 9A to 9C are process sectional views of a manufacturing method of a first variation of the second embodiment.

In the process sectional views of FIGS. 8A to 8E, the lower layer 12b of the stacked body 12 is continuous along the first surface 10a of the translucent substrate 10. This is because the stacked body 12 made of GaN is separated by laser irradiation more easily if the stacked body 12 is formed entirely on the wafer. In this case, the wafer including the stacked body 12 is desirably fixed onto a flat tool or jig by vacuum suction, adhesion or the like.

In this variation shown in FIGS. 9A to 9C, after the translucent substrate 10 is separated, the portion of the stacked body 12 between the light emitting elements is removed illustratively by further laser irradiation while the wafer including the stacked body 12 is fixed (FIG. 9A). Furthermore, a phosphor layer 30, a convex lens 32, and a solder ball 36 are formed (FIG. 9B), followed by singulation (FIG. 9C). Alternatively, the wafer including the stacked body 12 may be fixed to a jig which can be detached from the laser irradiation apparatus, and the stacked body 12 may be separated by a combination of photolithography and etching. Because the stacked body 12, which is rigid and thin, is separated into small size, the risk of cracking in the stacked body 12 in the subsequent handling of the wafer is significantly reduced. Furthermore, also after singulation, because the stacked body 12 is separated into small size, the stacked body 12 is resistant to cracking. Moreover, the package is soft as a whole, which results in enhancing the reliability of connection points after mounting. Furthermore, the package has small warpage, which facilitates mounting. Moreover, it can also be mounted on an object having a curved surface.

FIGS. 10A to 10F are process sectional views showing an example method for forming a lens.

Figure 10A:
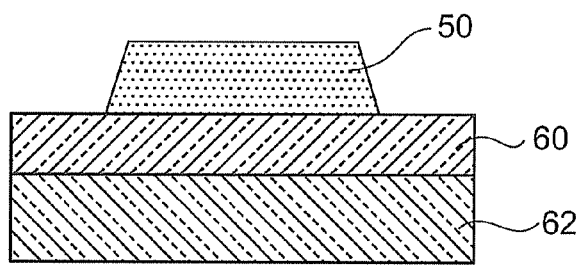
FIGS. 10A to 10F are process sectional views showing a method for forming a lens.
Figure 10B:
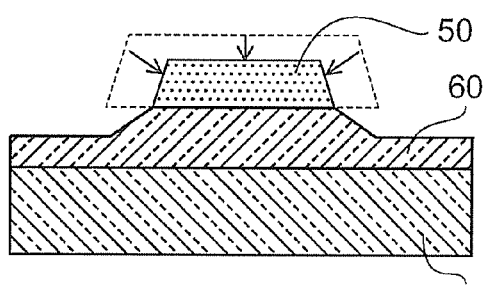
Figure 10C:
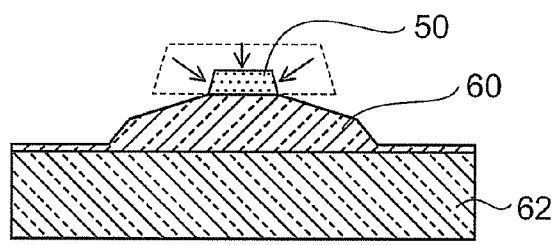
Figure 10D:
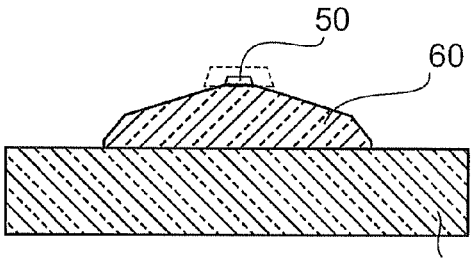

A quartz glass 60 is formed on the support 62 such as a semiconductor stacked body and phosphor layer, and a dot pattern of a photoresist 50 is formed thereon (FIG. 10A). Processing with low selection ratio for the resist is performed stepwise such as the first step (FIG. 10B), second step (FIG. 10C), and third step (FIG. 10D). In each step, the portion around the photoresist 50 is sloped while the resist dot pattern is reduced by etching.

Figure 10E:
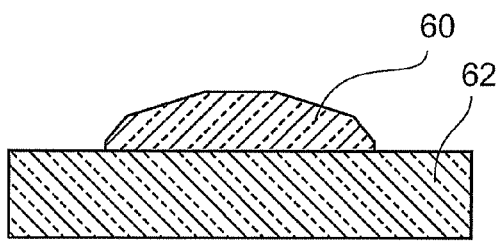
Figure 10F:
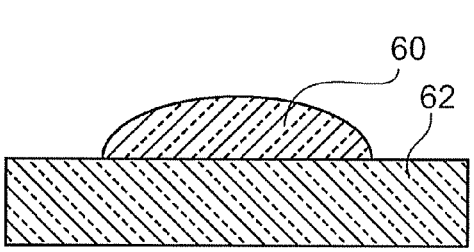

Hence, after the resist is stripped off, the cross section has a steeper slope downward (FIG. 10E). Then, mirror finishing by isotropic etching using CDE (chemical dry etching) or wet etching is performed to smooth the surface, and the lens is completed (FIG. 10F). Thus, a convex or concave lens can be formed on the light emitting device.

Figure 11A:
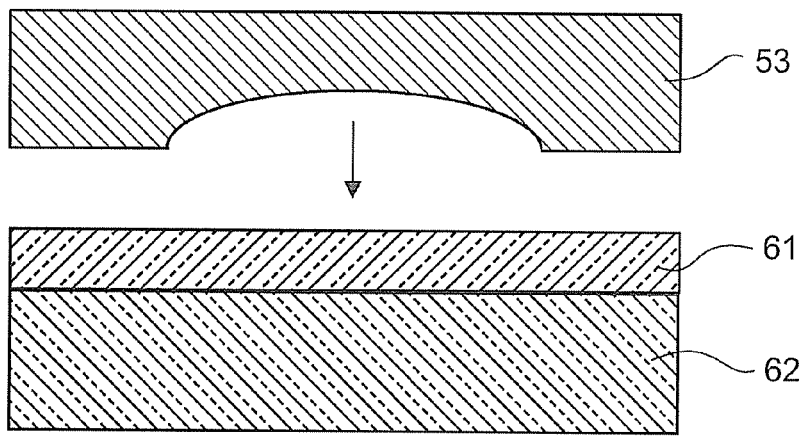
FIGS. 11A to 11C are process sectional views showing another example method for forming a lens.
Figure 11B:
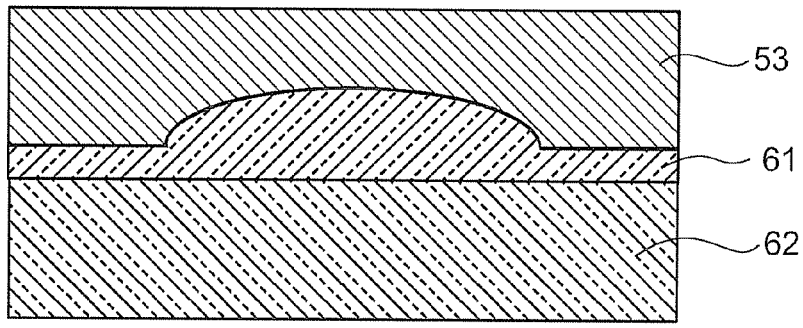
Figure 11C:
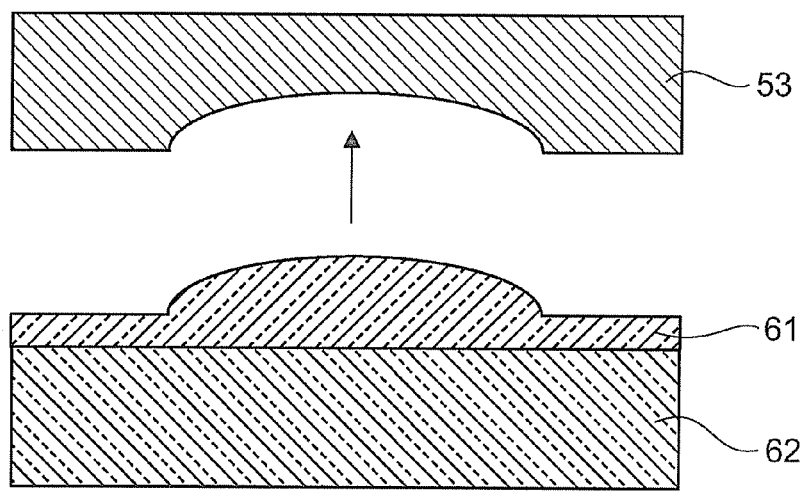

FIGS. 11A to 11C are process sectional views showing another example method for forming a lens.

As shown in these figures, it is also possible to use the nano-imprint process. An SOG (spin on glass) 61 or the like, which is liquid and heat-vitrifiable, is applied onto the support 62 illustratively by spincoating (FIG. 11A), and a nano-stamper 53, which is patterned like a lens, is pressed thereto to form a lens shape (FIG. 11B). Then, the nano-stamper 53 is stripped off, and the SOG 61 is vitrified by heating (FIG. 11C). In this process, the shape of the nano-stamper 53 can be arbitrarily designed, and hence a lens having any shape can be readily manufactured.

FIGS. 12A to 12D are process sectional views of a manufacturing method of a second variation of the second embodiment.

Figure 12A:
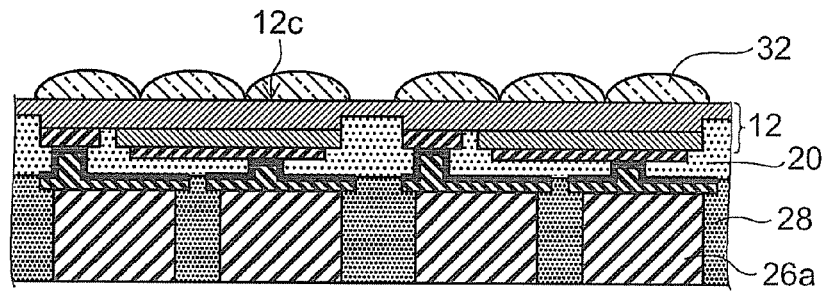
FIGS. 12A to 12D are process sectional views of a manufacturing method of a second variation of the second embodiment.
Figure 12B:
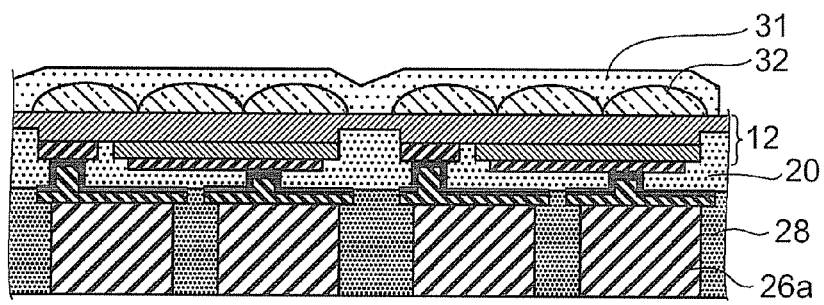
Figure 12C:
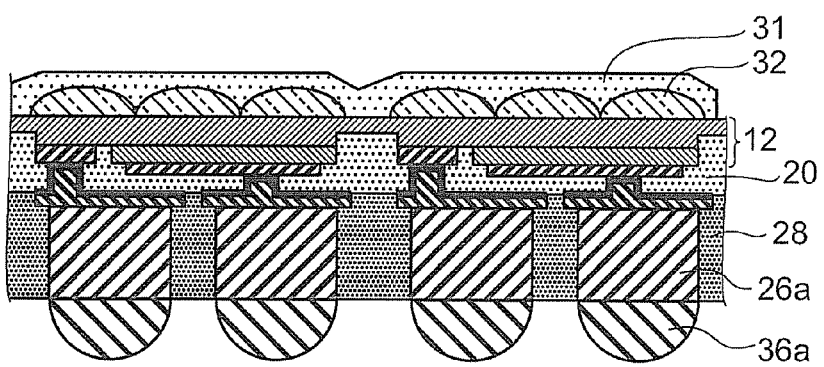
Figure 12D:
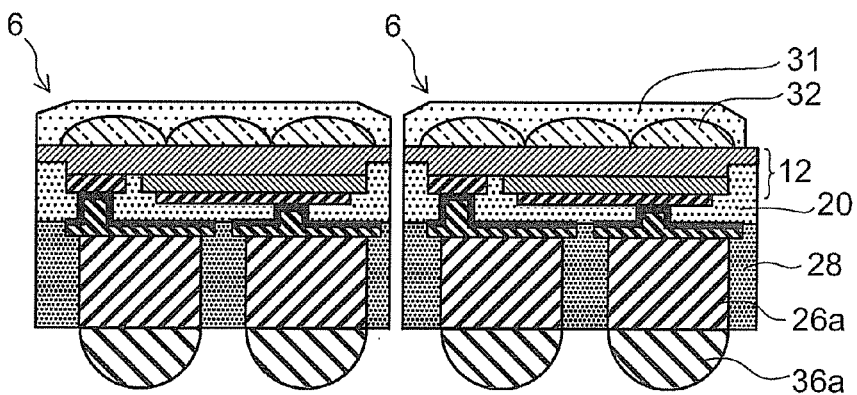
Figure 13A:
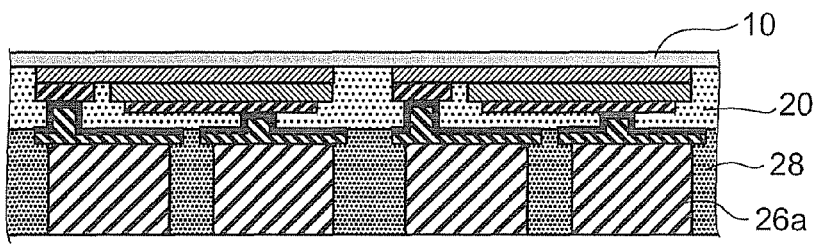
FIGS. 13A to 13E are process sectional views of a method for manufacturing a light emitting device according to a third embodiment.
Figure 13B:
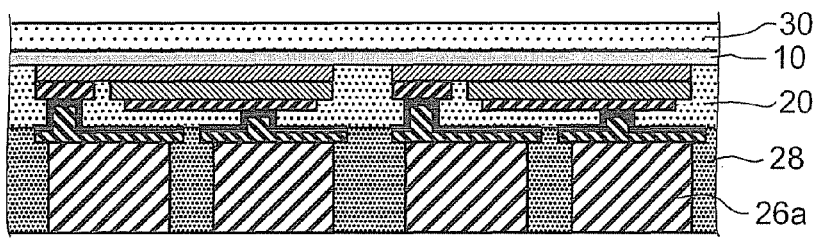
Figure 13C:
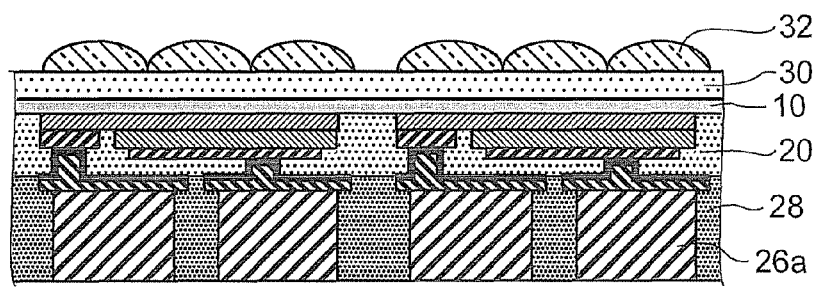
Figure 13D:
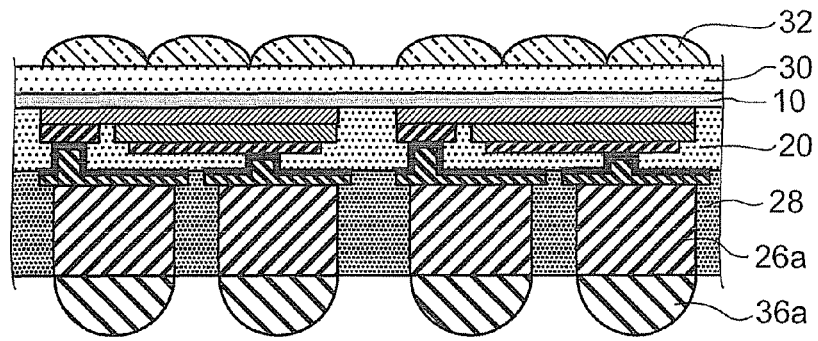
Figure 13E:
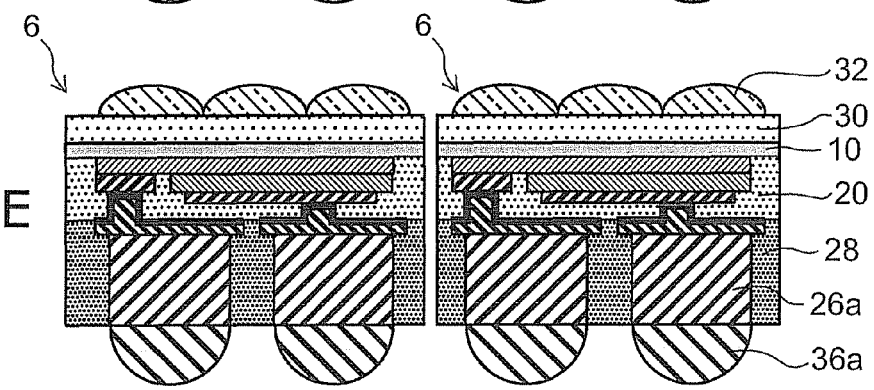

In this variation, a convex lens 32 is first formed on the first surface 12c of the stacked body 12 (FIG. 12A), and then a phosphor layer 31 is formed on the convex lens 32 (FIG. 12B). The ingredients of the phosphor layer 31 are the same as those of the aforementioned phosphor layer 30. Subsequently, a solder ball 36 is formed on the surface of the copper pillar 26 (FIG. 12C), and a light emitting device 6 is singulated (FIG. 12D).

In the singulated light emitting device 6 of the second embodiment and the variations associated therewith, by removing the substrate of the WLP-based light emitting device, a light emitting device having lower profile is provided.

FIGS. 13A to 13E are process sectional views of a method for manufacturing a light emitting device according to a third embodiment.

In the variation of the first embodiment shown in FIG. 2A, the thickness of the translucent substrate 10 can be reduced by grinding. For instance, leaving as much as several ten μm (FIG. 13A) facilitates enhancing the mechanical strength as compared with the structure in which the translucent substrate 10 is entirely removed. Subsequently, the processes of forming a phosphor layer 30 (FIG. 13B), forming a convex lens 32 (FIG. 13C), forming a solder ball 36 (FIG. 13D), and singulation (FIG. 13E) are performed.

FIGS. 14A to 14D are process sectional views of a manufacturing method of a variation of the third embodiment.

Figure 14A:
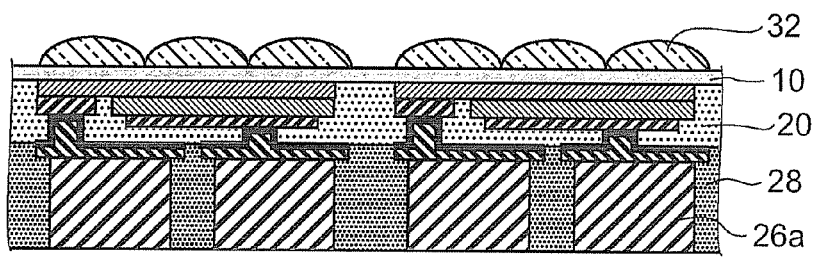
FIGS. 14A to 14D are process sectional views of a manufacturing method of a variation of the third embodiment.
Figure 14B:
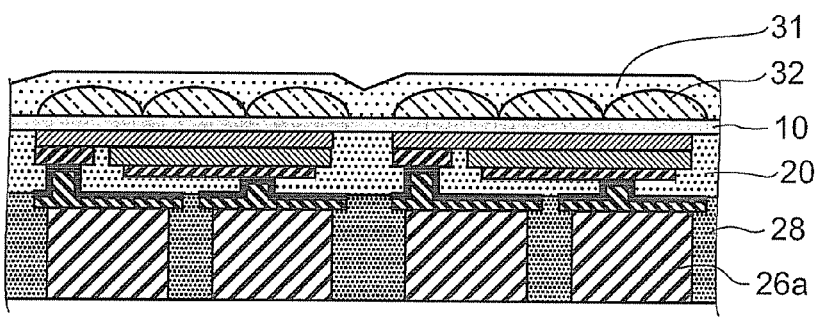
Figure 14C:
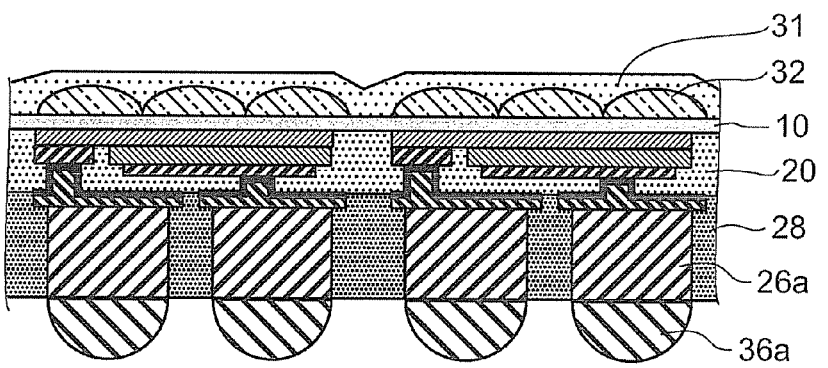
Figure 14D:
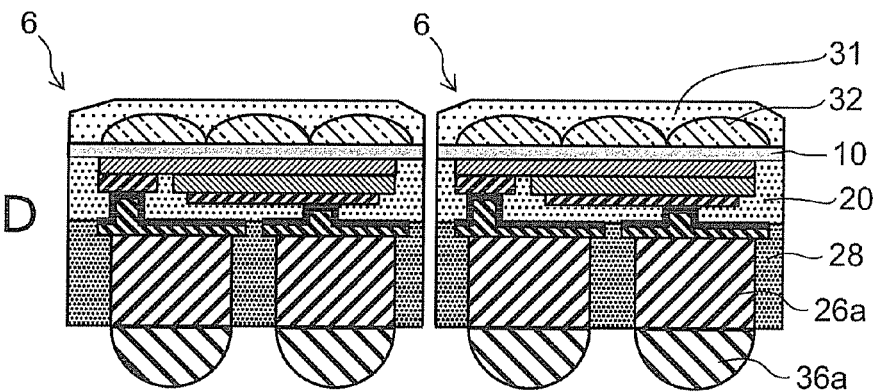

Forming a convex lens 32 as shown in FIG. 14A is followed by forming a phosphor layer 31 (FIG. 14B), forming a solder ball 36 (FIG. 14C), and singulation (FIG. 14D).

In the light emitting device of the third embodiment and its variation, thinning and leaving the translucent substrate 10 facilitates enhancing the mechanical strength while keeping small thickness.

Figure 15A:
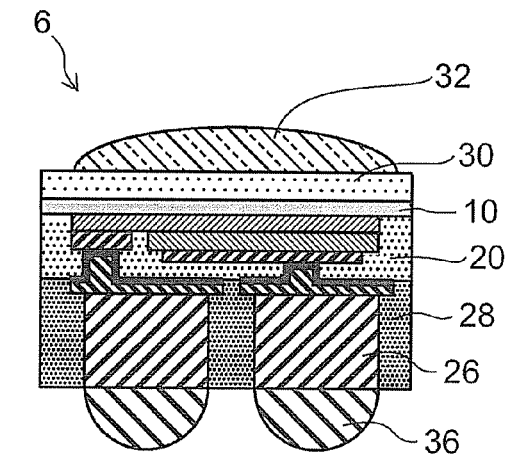
FIGS. 15A to 16C are schematic views of light emitting devices having lenses according to variations.
Figure 15B:
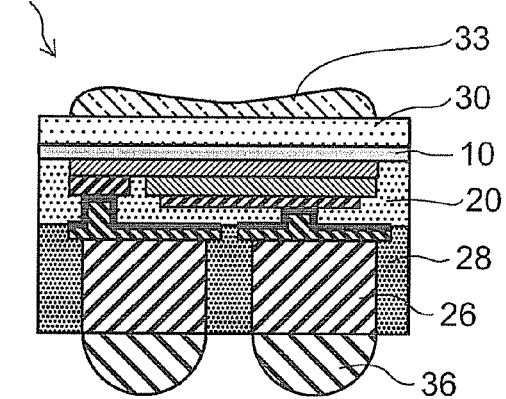
Figure 15C:
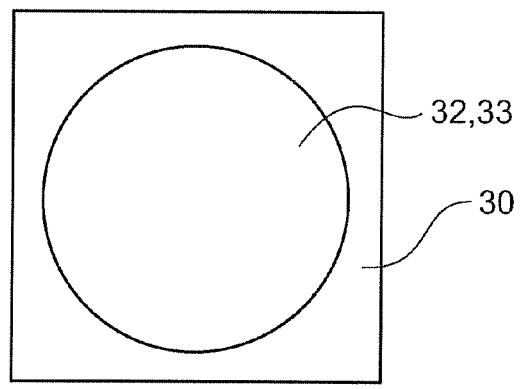

FIGS. 15A to 15C are schematic views of light emitting devices having lenses according to variations. More specifically, FIG. 15A is a sectional view for a single convex lens, FIG. 15B is a sectional view for a single concave lens, and FIG. 15C is a top view.

The lens in the first to third embodiment is an array lens. However, the embodiments are not limited thereto. It is also possible to use a single lens as shown in FIGS. 15A to 15C. Use of a single lens can simplify the optical design and manufacturing process.

Figure 16A:
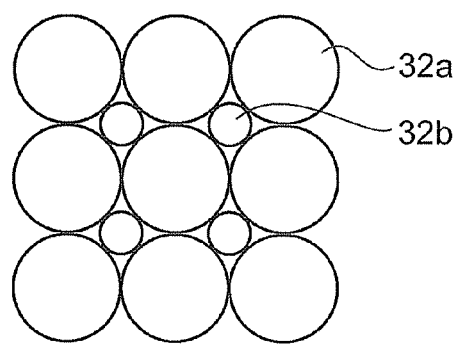
Figure 16B:
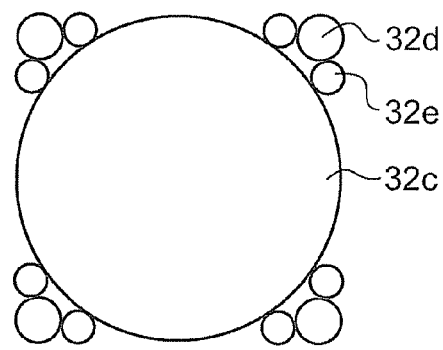
Figure 16C:
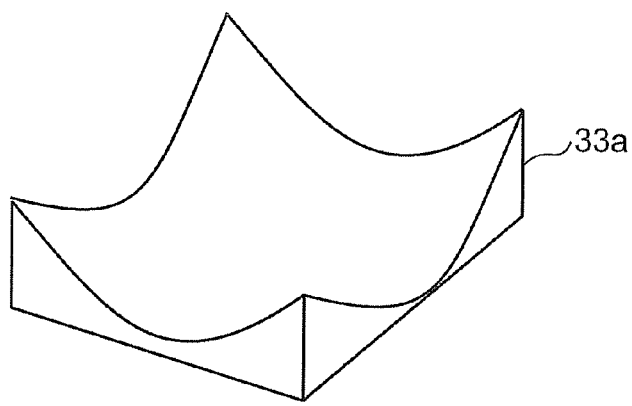

FIGS. 16A to 16C are schematic views of light emitting devices having lenses according to other variations.

As shown in the schematic plan views of FIGS. 16A and 16B, lenses 32a, 32b, 32c, 32d, 32e having different sizes may be arranged. The area covered with lenses can be increased by placing small lenses in a gap between large lenses. Furthermore, as shown in the schematic perspective view of FIG. 16C, a lens 33a having a rectangular outline may be used.

Figure 17A:
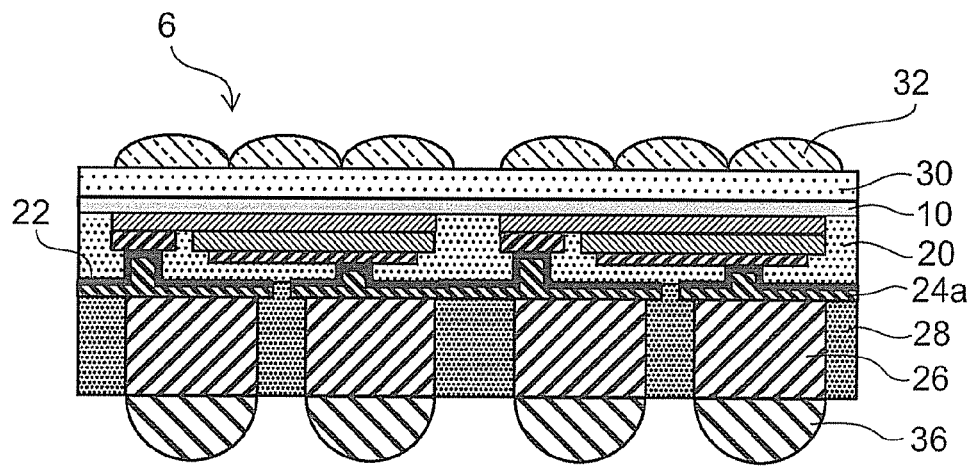
FIGS. 17A and 17B are schematic views of a light emitting device according to a fourth embodiment.
Figure 17B:
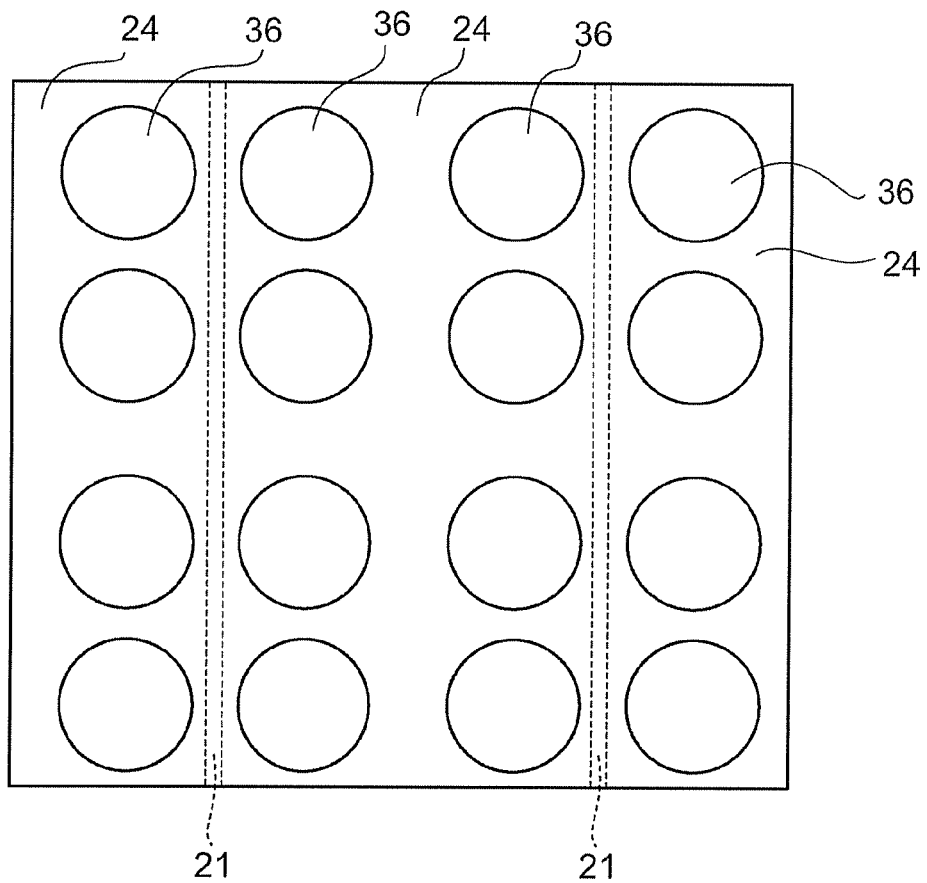

FIGS. 17A and 17B are schematic views of a light emitting device according to a fourth embodiment. More specifically, FIG. 17A is a sectional view, and FIG. 17B is a bottom view.

In this embodiment, adjacent stacked bodies are spaced from each other. Patterning is performed so that the first p-side electrode 14 of the first stacked body is connected to the second n-side electrode 16 of the second stacked body adjacent thereto. Furthermore, the seed metal 22 between the first stacked body and the second stacked body may be left unremoved. Thus, the seed metal 22 and the copper interconnection layer 24 are connected between the first and second light emitting element. That is, the two light emitting elements can be connected in series. Such series connection facilitates achieving higher output. It is understood that the number of series connection is not limited to two, but series connection with more stages is possible. Furthermore, stacked bodies adjacent in the direction crossing the juxtaposing direction of the first and second stacked body can be connected to each other to provide parallel connection.

Although FIGS. 17A and 17B show the seed metal 22 and the copper interconnection layer 24 connected among 2×2 light emitting elements, the 2×2 light emitting elements do not necessarily need to be separated on the outside thereof. If this configuration continues throughout the wafer, light emitting elements can be cut out in arbitrary units.

FIGS. 18A to 19B are process sectional views of a manufacturing method of a variation of the fourth embodiment.

Figure 18A:
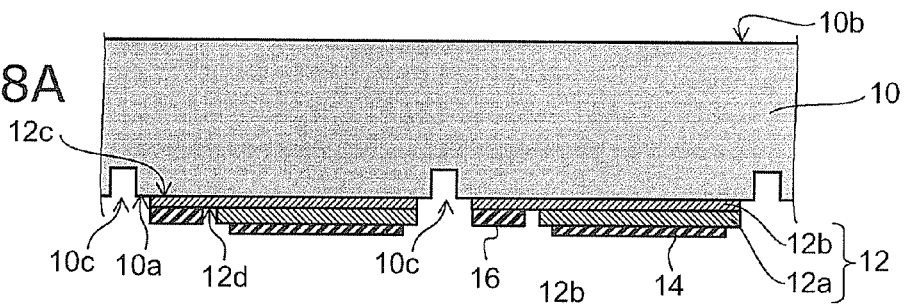
FIGS. 18A to 19B are process sectional views of a manufacturing method of a variation of the fourth embodiment.
Figure 18B:
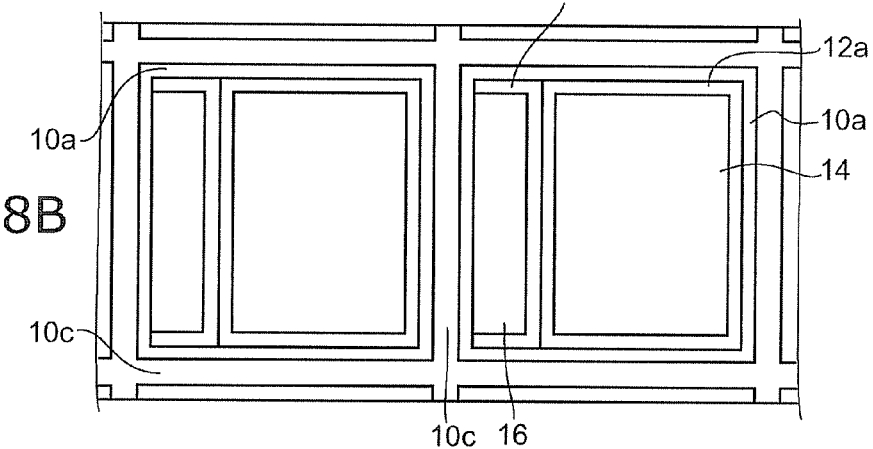
Figure 18C:
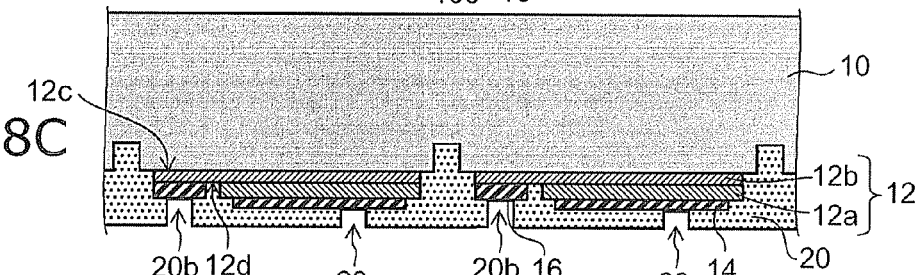
Figure 18D:
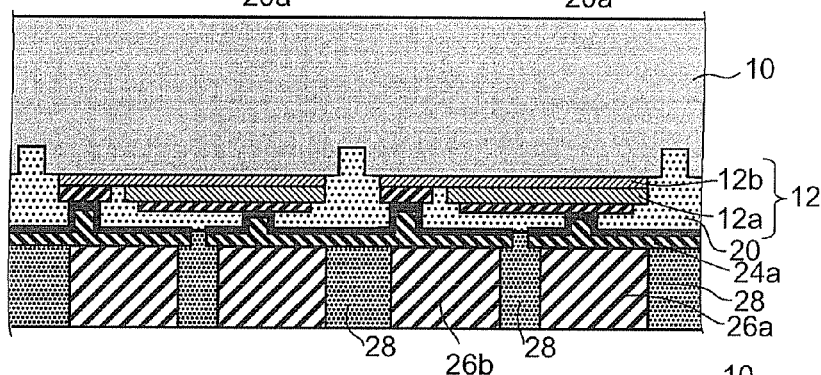
Figure 18E:
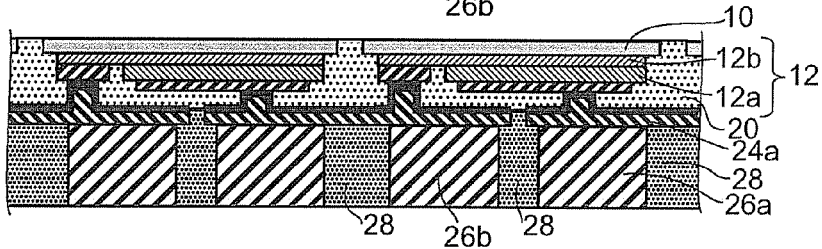
Figure 19A:
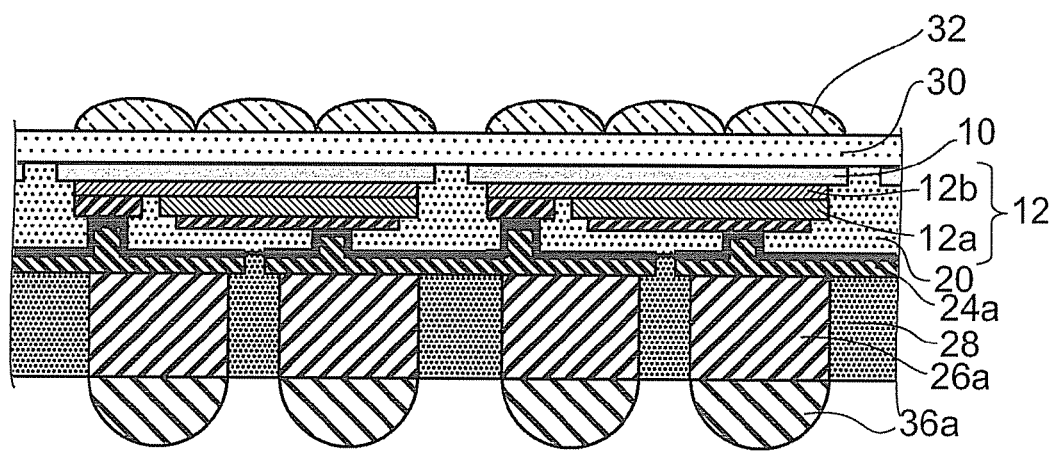
Figure 19B:
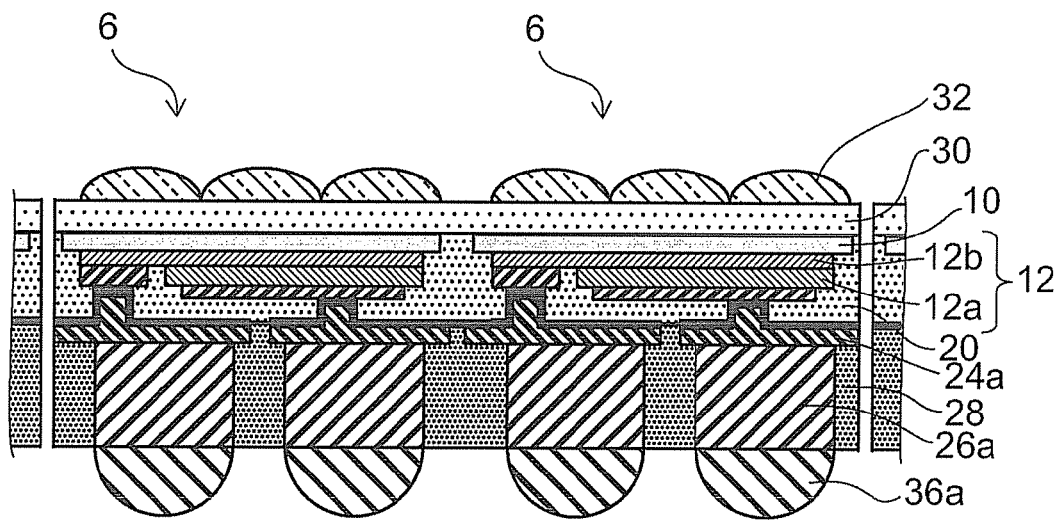

The translucent substrate 10 may be separated for each light emitting element. This can realize a very reliable structure because the individual light emitting element is protected by the rigid translucent substrate 10. Furthermore, in the manufacturing method therefor, as shown in FIG. 18A, a groove 10c can be formed in the gap of the translucent substrate 10 between the light emitting elements from the light emitting element formation surface 10a side. The groove 10c can be formed illustratively before or after the step of forming the light emitting element, and can be based on a method such as etching, laser processing, and blade cutting. Then, because the rigid translucent substrate 10 is singulated into small size when the translucent substrate 10 is thinly ground later (FIG. 18E), the risk of cracking can be significantly reduced. In addition, also in singulation into packages, because the portion free from the rigid translucent substrate is cut (FIGS. 19A and 19B), high productivity and yield can be achieved. Furthermore, also after singulation, because the translucent substrate 10 and the stacked body 12 are separated into small size, the translucent substrate 10 and the stacked body 12 are resistant to cracking. Moreover, the package is soft as a whole, which results in enhancing the reliability of connection points after mounting. Furthermore, the package has small warpage, which facilitates mounting. Moreover, it can also be mounted on an object having a curved surface.

Figure 20A:
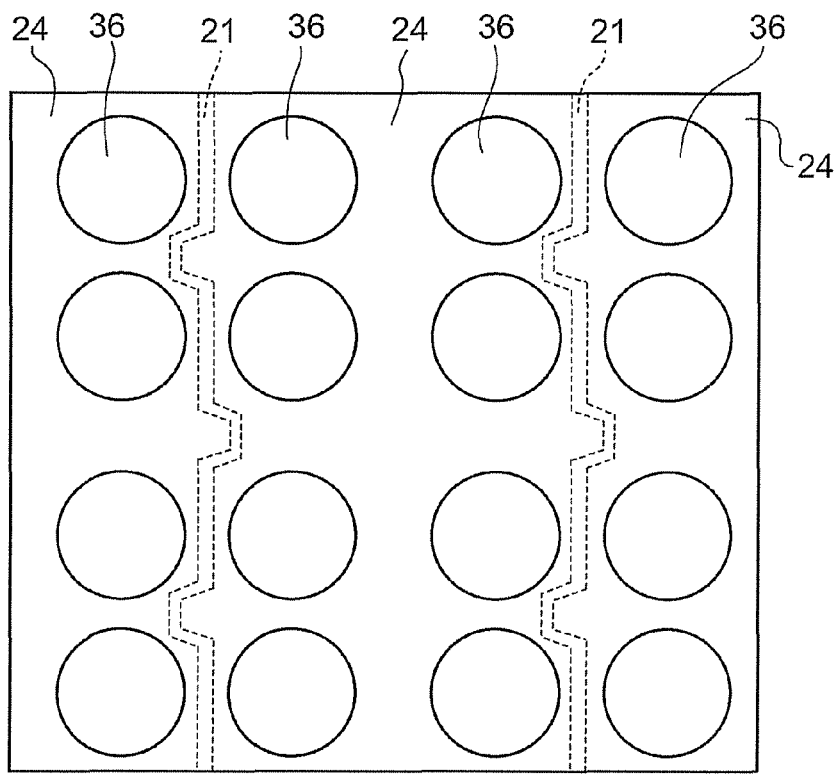
FIGS. 20A and 20B are schematic views showing variations of the pattern of the metal interconnection layer.
Figure 20B:
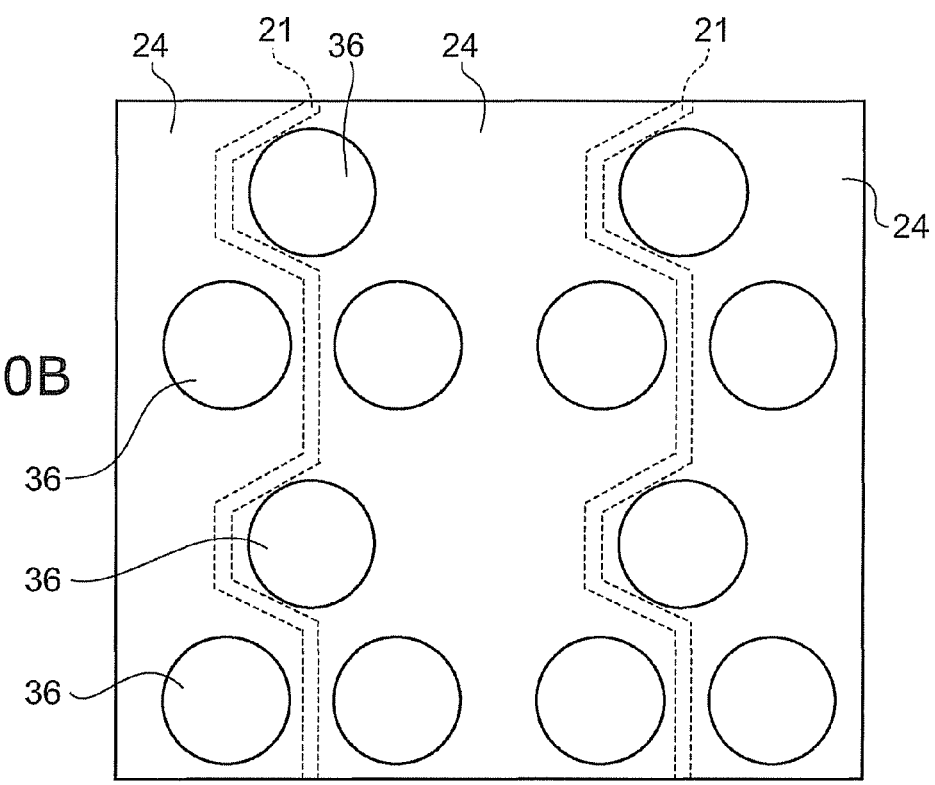

FIGS. 20A and 20B are schematic views showing variations of the pattern of the copper interconnection layer.

In FIG. 17B, the separating region 21 between the p-side electrode 14 and the n-side electrode 16 is linear. Hence, the wafer may crack in the separating region 21. In contrast, if the separating portion (dashed line) between the p-side electrode 14 and the n-side electrode 16 is meandered as shown in FIGS. 20A and 20B, the protruding portion of the copper interconnection layer 24 serves for reinforcement, which facilitates maintaining the mechanical strength even if the translucent substrate 10 is thinned by grinding. In FIG. 20A, the copper pillars 26 are arranged in a generally lattice-like configuration. However, it is also possible to use an arrangement as shown in FIG. 20B. It is understood that a similar effect is achieved also in the configuration where the translucent substrate 10 is separated.

Figure 21A:
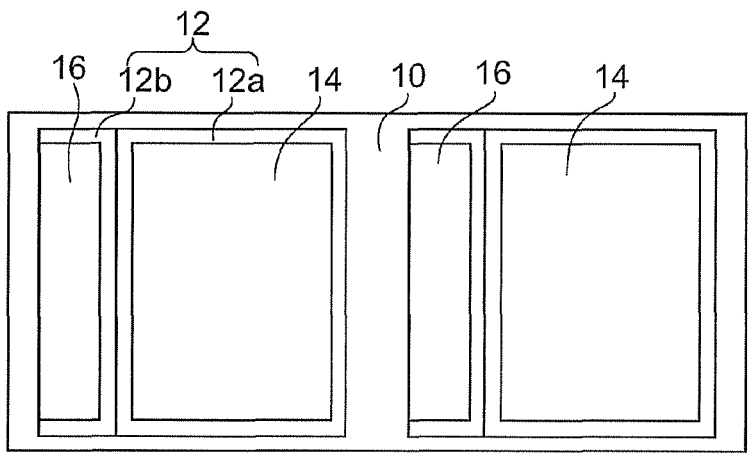
FIGS. 21A to 21D are schematic plan views showing variations of the electrode pattern.
Figure 21B:
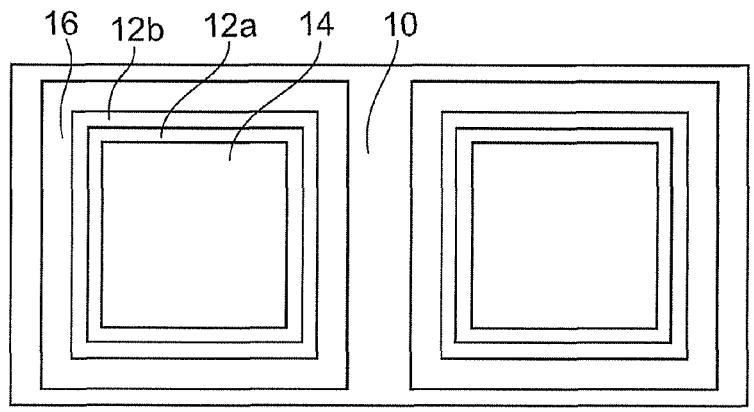
Figure 21C:
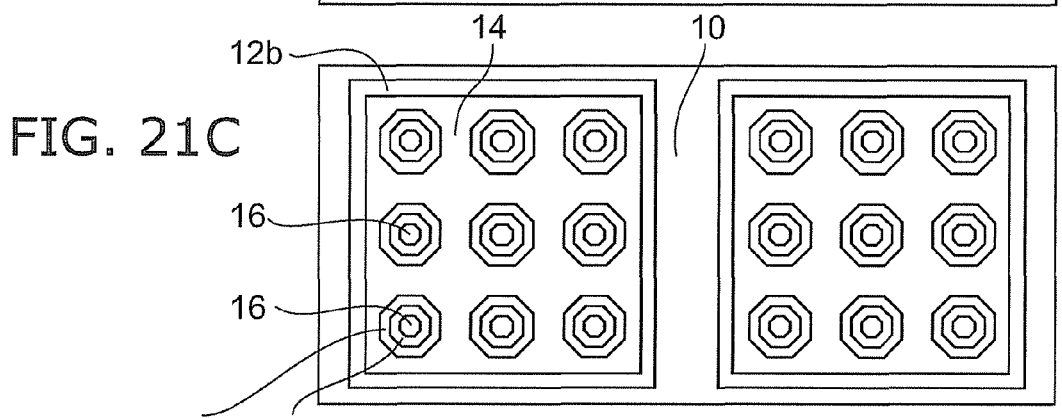
Figure 21D:
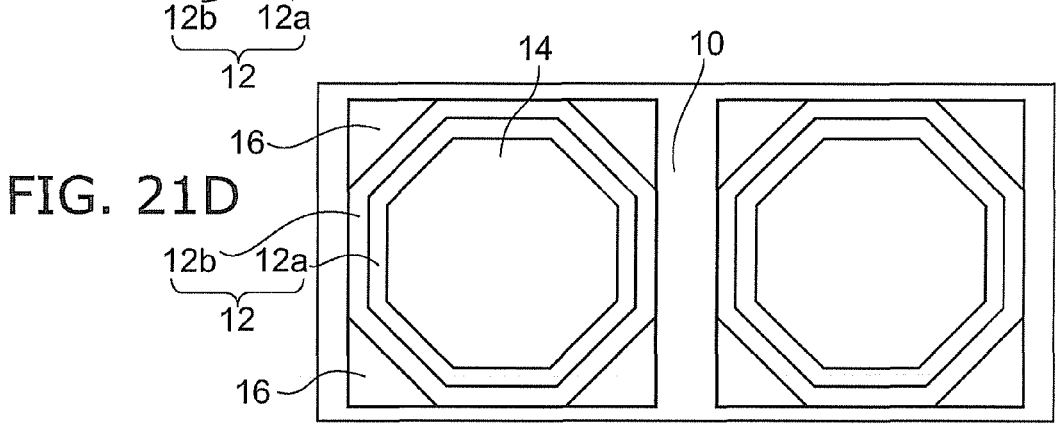

FIGS. 21A to 21D are schematic plan views showing variations of the electrode pattern of the light emitting element. More specifically, FIG. 21A shows a basic pattern for two chips, and FIGS. 21B to 21D show its variations.

Light emission occurs in the region where the current flows in the vertical direction of the chip. Hence, a high optical output can be achieved by increasing the area of the upper layer 12a including the light emitting layer 12e. Here, the area of the lower layer 12b exposed by removal of the upper layer 12a is an n-type non-emitting region, and low contact resistance to the n-side electrode 16 is readily achieved even if the area is small.

It is difficult to decrease the area of the n-side electrode 16 to below the size of the bump for flip-chip mounting. However, in this embodiment, even if the area of the n-side electrode 16 is decreased, the copper interconnection layer 24 can be used for connection to an extraction electrode with a large area. If the area of the extraction electrode connected to the p-side electrode 14 is generally equal to the size of the extraction electrode connected to the n-side electrode 16, the device can be mounted on the substrate through the solder ball 36 in a balanced manner.

In FIG. 21B, the upper layer 12a including the light emitting layer 12e is placed at the center, and the n-type lower layer 12b is placed therearound. This can shorten the current supply path. Furthermore, because the light emitting region is located at the center, it can be readily aligned with the optical axis of the lens.

In FIG. 21C, the lower layer 12b is exposed at lattice-like positions where the n-side electrode 16 is provided, and the p-side electrode 14 is provided therearound. This can further shorten the current path.

In FIG. 21D, the p-side electrode 14 is placed at the center, and the n-side electrode 16 is placed at four corners therearound. This can further increase the light emitting region. Furthermore, because the light emitting region is located at the center, it can be readily aligned with the optical axis of the lens.

The first to fourth embodiment and the variations thereof can provide light emitting devices downsized closed to the bare chip size. These light emitting devices can be widely used in, for instance, illumination devices, display devices, and backlight sources for image display devices.

Furthermore, in the manufacturing method therefor, the assembly and inspection process can be performed at wafer level, which facilitates achieving high productivity. Hence, cost reduction can be achieved.

Furthermore, the first to third phosphor has good temperature characteristics illustratively in the temperature range from 0 to 200° C. For instance, although the light emission intensity of the first to third phosphor gradually decreases with the increase of temperature, the relative value of the light emission intensity at 200° C. remains approximately 50%, assuming that the relative value of the light emission intensity at room temperature is 100%. In contrast, for $(Sr_{0.999}Eu_{0.001})_2$ S, which is a phosphor developing a red color and not a sialon phosphor, the light emission intensity becomes 40% or less at over 100° C., and decreases to approximately 10% at 200° C.

That is, in the first to fourth embodiment and the variations thereof, the temperature characteristics of the light emission intensity are improved.

The embodiments have been described with reference to the drawings. However, the embodiments are not limited thereto. Those skilled in the art can variously modify the size, shape, material, layout and the like of the light emitting element, stacked body, translucent substrate, seed metal, metal interconnection layer, metal pillar, reinforcing resin, phosphor layer, lens, and electrode constituting the embodiments, and such modifications are also encompassed within the scope of the embodiments as long as they do not depart from the spirit of the embodiments.

In another aspect of the embodiments, the method for manufacturing a light emitting device further comprises, after forming a resin, thinning or removing the translucent substrate.

Furthermore, in one aspect, the method for manufacturing a light emitting device further comprises, after forming a resin, removing the translucent substrate and separating the exposed stacked body.

Furthermore, in one aspect, the method for manufacturing a light emitting device further comprises, before forming an insulating film on the second surface side of the stacked body, forming a groove on the first surface side of the translucent substrate, and after forming a resin, thinning the translucent substrate until the translucent substrate is separated.

Furthermore, in one aspect, the method for manufacturing a light emitting device comprises forming a phosphor layer on one of the second surface opposite to the first surface of the translucent substrate, the surface of the translucent substrate ground from the second surface side, and the second surface of the stacked body.

Furthermore, in one aspect, in the light emitting device, one of the p-side electrode and the n-side electrode is provided on the non-emitting region of the stacked body, and the area of the one electrode is smaller than the area of the metal interconnection layer connected thereto.

Furthermore, in one aspect, the light emitting device further comprises a phosphor layer provided on the first surface side of the stacked body and being operable to absorb emission light from the light emitting layer and emit wavelength-converted light, and a lens provided on the first surface side of the stacked body and being operable to converge or diverge at least the emission light, wherein the emission light and the wavelength-converted light can be emitted.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A method for manufacturing a light emitting device, comprising:
   forming a stacked body including a light emitting layer and having a first surface adjacent to a first surface of a translucent substrate;
   forming an insulating film having a first and second opening on a p-side electrode and an n-side electrode provided on a side of a second surface opposite to the first surface of the stacked body;
   forming a seed metal covering the insulating film and the first and second opening;
   forming a p-side metal interconnection layer and an n-side metal interconnection layer on the seed metal;
   separating the seed metal into a p-side seed metal and an n-side seed metal by removing the seed metal exposed between the p-side metal interconnection layer and the n-side metal interconnection layer;
   forming a resin in at least part of the space from which the seed metal is removed;
   removing the translucent substrate from the stacked body; and
   forming a phosphor layer containing silicon (Si), aluminum (Al), oxygen (O), and nitrogen (N) on a side of the first surface of the stacked body including the light emitting layer.

2. The method according to claim 1, wherein the phosphor layer contains a phosphor which exhibits a light emission peak at a wavelength ranging from 490 to 580 nm when excited by light with a wavelength of 250 to 500 nm, and has a composition represented by the following formula (1)

$$(M_{1-x})_{a2}AlSi_{b2}O_{c2}N_{d2} \tag{1}$$

where M is at least one metallic element except Si and Al, R is an emission center element, and x, a2, b2, c2, and d2 satisfy the relations $0<x\leqq1$, $0.93<a2<1.3$, $4.0<b2<5.8$, $0.6<c2<1$, and $6<d2<11$.

3. The method according to claim 1, wherein the phosphor layer contains a phosphor which exhibits a light emission peak at a wavelength ranging from 490 to 580 nm when excited by light with a wavelength of 250 to 500 nm, and has a composition represented by the following formula (2)

$$(M_{1-x})_{a2}AlSi_{b2}O_{c2}N_{d2} \tag{2}$$

where M is at least one metallic element except Si and Al, R is an emission center element, and x, a2, b2, c2, and d2 satisfy the relations $0<x\leqq1$, $0.94<a2<1.1$, $4.1<b2<4.7$, $0.7<c2<0.85$, and $7<d2<9$.

4. The method according to claim 1, wherein the phosphor layer contains a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \tag{3}$$

where M is at least one metallic element except Si and Al, R is an emission center element, and x, a1, b1, c1, and d1 satisfy the relations $0<x\leqq1$, $0.6<a1<0.95$, $2<b1<3.9$, $0.25<c1<0.45$, and $4<d1<5.7$.

5. The method according to claim 1, wherein the phosphor layer contains a phosphor which exhibits a light emission peak at a wavelength ranging from 490 to 580 nm when excited by light with a wavelength of 250 to 500 nm, and has a composition represented by the following formula (1)

$$(M_{1-x}R_x)_{a2}AlSi_{b2}O_{c2}N_{d2} \tag{1}$$

where M is at least one metallic element except Si and Al, R is an emission center element, and x, a2, b2, c2, and d2 satisfy the relations $0<x\leqq1$, $0.93<a2<1.3$, $4.0<b2<5.8$, $0.6<c2<1$, and $6<d2<11$ and
a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \tag{3}$$

Where M is at least one metallic element except Si and Al, R is an emission center element, and x, a1, b1, c1, and d1 satisfy the relations $0 < x \leq 1$, $0.6 < a1 < 0.95$, $2 < b1 < 3.9$, $0.25 < c1 < 0.45$, and $4 < d1 < 5.7$.

6. The method according to claim 1, wherein the phosphor layer contains a phosphor which exhibits a light emission peak at a wavelength ranging from 490 to 580 nm when excited by light with a wavelength of 250 to 500 nm, and has a composition represented by the following formula (2)

$$(M_{1-x}R_x)_{a2}AlSi_{b2}O_{c2}N_{d2} \quad (2)$$

where M is at least one metallic element except Si and Al, R is an emission center element, and x, a2, b2, c2, and d2 satisfy the relations $0 < x \leq 1$, $0.94 < a2 < 1.1$, $4.1 < b2 < 4.7$, $0.7 < c2 < 0.85$, and $7 < d2 < 9$ and a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \quad (3)$$

where M is at least one metallic element except Si and Al, R is an emission center element, and x, a1, b1, c1, and d1 satisfy the relations $0 < x \leq 1$, $0.6 < a1 < 0.95$, $2 < b1 < 3.9$, $0.25 < c1 < 0.45$, and $4 < d1 < 5.7$.

7. The method according to claim 1, further comprising:
forming a p-side metal pillar and an n-side metal pillar on the p-side metal interconnection layer and the n-side metal interconnection layer, respectively.

8. The method according to claim 1, wherein
the forming a stacked body includes forming a first and second stacked body spaced from and being adjacent to each other,
the forming the p-side metal interconnection layer and the n-side metal interconnection layer includes connectedly forming a first p-side metal interconnection layer provided on a side of the first stacked body and a second n-side metal interconnection layer provided on a side of the second stacked body, and
the separating the seed metal into the p-side seed metal and the n-side seed metal includes removing the seed metal exposed between a first n-side metal interconnection layer provided on the side of the first stacked body and the first p-side metal interconnection layer to separate the seed metal into a first n-side seed metal and a first p-side seed metal, and removing the seed metal exposed between a second p-side metal interconnection layer provided on the side of the second stacked body and the second n-side metal interconnection layer to separate the seed metal into a second p-side seed metal and a second n-side seed metal.

9. A light emitting device comprising:
a stacked body having a first surface and a second surface opposite to the first surface and including a light emitting layer; the stacked body provided on a substrate, and the substrate removed from the stacked body;
a p-side electrode and an n-side electrode provided on the second surface of the stacked body;
an insulating film having openings to which the p-side electrode and the n-side electrode are exposed;
a p-side extraction electrode including a p-side metal interconnection layer provided on the p-side electrode;
an n-side extraction electrode including an n-side metal interconnection layer provided on the n-side electrode;
a resin layer filled around the p-side extraction electrode and the n-side extraction electrode; and a phosphor layer containing silicon (Si), aluminum (Al), oxygen (O), and nitrogen (N) provided on a side of the first surface of the stacked body including the light emitting layer, emission light from the light emitting layer being emitted through the first surface of the stacked body.

10. The device according to claim 9, wherein the phosphor layer contains a phosphor which exhibits a light emission peak at a wavelength ranging from 490 to 580 nm when excited by light with a wavelength of 250 to 500 nm, and has a composition represented by the following formula (1)

$$(M_{1-x}R_x)_{a2}AlSi_{b2}O_{c2}N_{d2} \quad (1)$$

where M is at least one metallic element except Si and Al, R is an emission center element, and x, a2, b2, c2, and d2 satisfy the relations $0 < x \leq 1$, $0.93 < a2 < 1.3$, $4.0 < b2 < 5.8$, $0.6 < c2 < 1$, and $6 < d2 < 11$.

11. The device according to claim 9, wherein the phosphor layer contains a phosphor which exhibits a light emission peak at a wavelength ranging from 490 to 580 nm when excited by light with a wavelength of 250 to 500 nm, and has a composition represented by the following formula (2)

$$(M_{1-x}R_x)_{a2}AlSi_{b2}O_{c2}N_{d2} \quad (2)$$

where M is at least one metallic element except Si and Al, R is an emission center element, and x, a2, b2, c2, and d2 satisfy the relations $0 < x \leq 1$, $0.94 < a2 < 1.1$, $4.1 < b2 < 4.7$, $0.7 < c2 < 0.85$, and $7 < d2 < 9$.

12. The device according to claim 9, wherein the phosphor layer contains a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \quad (3)$$

where M is at least one metallic element except Si and Al, R is an emission center element, and x, a1, b1, c1, and d1 satisfy the relations $0 < x \leq 1$, $0.6 < a1 < 0.95$, $2 < b1 < 3.9$, $0.25 < c1 < 0.45$, and $4 < d1 < 5.7$.

13. The device according to claim 9, wherein the phosphor layer contains a phosphor which exhibits a light emission peak at a wavelength ranging from 490 to 580 nm when excited by light with a wavelength of 250 to 500 nm, and has a composition represented by the following formula (1)

$$(M_{1-x}R_x)_{a2}AlSi_{b2}O_{c2}N_{d2} \quad (1)$$

where M is at least one metallic element except Si and Al, R is an emission center element, and x, a2, b2, c2, and d2 satisfy the relations $0 < x \leq 1$, $0.93 < a2 < 1.3$, $4.0 < b2 < 5.8$, $0.6 < c2 < 1$, and $6 < d2 < 11$ and a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \quad (3)$$

where M is at least one metallic element except Si and Al, R is an emission center element, and x, a1, b1, c1, and d1 satisfy the relations $0 < x \leq 1$, $0.6 < a1 < 0.95$, $2 < b1 < 3.9$, $0.25 < c1 < 0.45$, and $4 < d1 < 5.7$.

14. The device according to claim 9, wherein the phosphor layer contains a phosphor which exhibits a light emission peak at a wavelength ranging from 490 to 580 nm when excited by light with a wavelength of 250 to 500 nm, and has a composition represented by the following formula (2)

$$(M_{1-x}R_x)_{a2}AlSi_{b2}O_{c2}N_{d2} \quad (2)$$

where M is at least one metallic element except Si and Al, R is an emission center element, and x, a2, b2, c2, and d2 satisfy the relations $0<x\leq1$, $0.94<a2<1.1$, $4.1<b2<4.7$, $0.7<c2<0.85$, and $7<d2<9$ and a phosphor which exhibits a light emission peak at a wavelength ranging from 580 to 700 nm when excited by light with a wavelength of 250 to 500 nm, and has a composition represented by the following formula (3)

$$(M_{1-x}R_x)_{a1}AlSi_{b1}O_{c1}N_{d1} \tag{3}$$

where M is at least one metallic element except Si and Al, R is an emission center element, and x, a1, b1, c1, and d1 satisfy the relations $0<x\leq1$, $0.6<a1<0.95$, $2<b1<3.9$, $0.25<c1<0.45$, and $4<d1<5.7$.

15. The device according to claim 9, wherein a p-side metal pillar is formed on the p-side metal interconnection layer and an n-side metal pillar is formed on the n-side metal interconnection layer.

16. The device according to claim 15, wherein a thickness of the p-side metal pillar and a thickness of the n-side metal pillar are thicker than a thickness of the stacked body.

17. The device according to claim 1, wherein a side surface of the light emitting layer is covered by the insulating film.

* * * * *